A solid-state memory in which each memory cell includes a cross-point addressable write element. Each memory cell includes a storage element, such as a pair of cross-coupled inverters, and a read buffer for coupling one of the storage nodes to a read bit line for the column containing the cell. The write element of each memory cell includes one or a pair of write select transistors controlled by a write word line for the row containing the cell, and write pass transistors connected to corresponding storage nodes and connected in series with a write select transistor. The write pass transistors are gated by a write bit line for the column containing the cell. In operation, a write reference is coupled to one of the storage nodes of a memory cell in the selected column and the selected row, depending on the data state carried by the complementary write bit lines for that column.

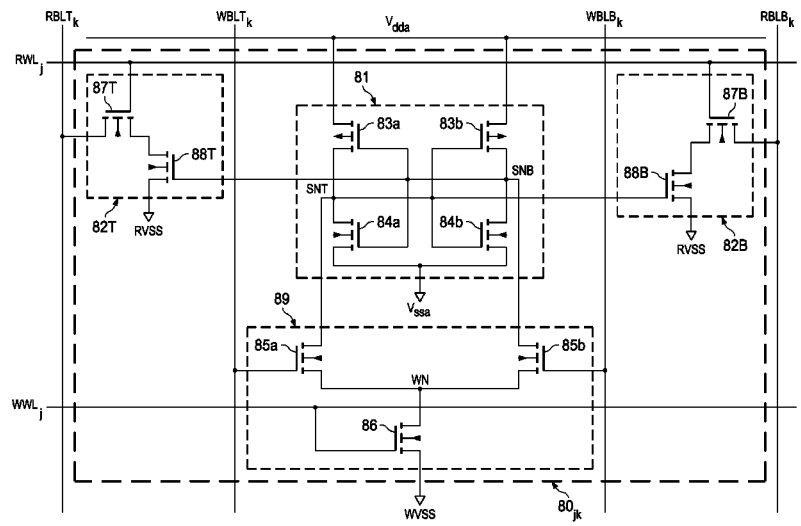

DISTURB-FREE STATIC RANDOM ACCESS MEMORY CELL

CROSS-REFERENCE TO RELATED APPLICATIONS

This application claims priority, under 35 U.S.C. §119(e), of Provisional Application No. 61/365,165, filed Jul. 16, 2010, incorporated herein by this reference.

STATEMENT REGARDING FEDERALLY SPONSORED RESEARCH OR DEVELOPMENT

Not applicable.

BACKGROUND OF THE INVENTION

This invention is in the field of solid-state memory. Embodiments of this invention are more specifically directed to static random access memory (SRAM) cells and devices.

Many modern electronic devices and systems now include substantial computational capability for controlling and managing a wide range of functions and useful applications. The computational power of these modern devices and systems is typically provided by one or more processor "cores". These processor cores operate as a digital computer, in general retrieving executable instructions from memory, performing arithmetic and logical operations on digital data retrieved from memory, and storing the results of those operations in memory. Other input and output functions for acquiring and outputting the data processed by the processor cores are performed as appropriate. Considering the large amount of digital data often involved in performing the complex functions of these modern devices, significant solid-state memory capacity is now commonly implemented in the electronic circuitry for these systems.

Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, this physical scaling of device sizes raises significant issues, especially in connection with embedded SRAM and in SRAM realized as "stand-alone" memory integrated circuit devices. Several of these issues are due to increased variability in the electrical characteristics of transistors formed at these extremely small feature sizes. This variability in characteristics has been observed to increase the likelihood of read and write functional failures, on a cell-to-cell basis. Sensitivity to device variability is especially high in those memories that are at or near their circuit design limits. The combination of increased device variability with the larger number of memory cells (and thus transistors) within an integrated circuit renders a high likelihood that one or more cells cannot be read or written as expected.

An example of a conventional SRAM cell is shown in FIG. 1a. In this example, SRAM cell 12 is a conventional six-transistor (6-T) static memory cell 12, which in this case is in the $j^{th}$ row and $k^{th}$ column of a memory array. SRAM memory cell 12 is biased between the voltage on power supply line $V_{dda}$ and a ground reference voltage $V_{ssa}$. SRAM memory cell 12 is constructed in the conventional manner as a pair of cross-coupled CMOS inverters, one inverter of series-connected p-channel load transistor 13a and n-channel driver transistor 14a, and the other inverter of series-connected p-channel load transistor 13b and n-channel transistor 14b; the gates of the transistors in each inverter are connected together and to the common drain node of the transistors in the other inverter, in the usual manner. The common drain node of transistors 13a, 14a constitutes storage node SNT, and the common drain node of transistors 13b, 14b constitutes storage node SNB, in this example. N-channel pass transistor 15a has its source/drain path connected between storage node SNT and bit line $BLT_k$ for the $k^{th}$ column, and n-channel pass transistor 15b has its source/drain path connected between storage node SNB and bit line $BLB_k$. The gates of pass transistors 15a, 15b are driven by word line $WL_j$ for this $j^{th}$ row in which cell 12 resides.

In operation, bit lines $BLT_k$, $BLB_k$ are typically precharged to a high voltage (at or near power supply voltage $V_{dda}$), and are equalized to the same voltage at the beginning of both read and write cycles, after which bit lines $BLT_k$, $BLB_k$ then float at that precharged voltage. To access cell 12 for a read operation, word line $WL_j$ is then energized, turning on pass transistors 15a, 15b, and connecting storage nodes SNT, SNB to the then-floating precharged bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of then-floating precharged bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 12 to latch in the desired state.

As mentioned above, device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node SNT, if bit line $BLT_k$ is unable to sufficiently discharge storage node SNT to trip the inverter of transistors 13b and 14b, cell 12 may not latch to the desired data state. Cell stability failures are the converse of write failures—a write failure occurs if a cell is too stubborn in changing its state, while a cell stability failure occurs if a cell changes its state too easily.

One conventional approach toward satisfying both cell stability and write margin constraints is the construction of high performance SRAM memories using eight transistor ("8-T") memory cells. An example of this 8-T construction is illustrated in FIG. 1b in connection with SRAM cell $12'_{j,k}$ (in row j and column k, as before), which includes a 6-T latch in combination with a two-transistor read buffer. Cell $12'_{j,k}$ includes the 6-T latch of transistors 13p, 13n, 14p, 14n, 15a, 15b, as described above relative to FIG. 1b. However, in cell 12'$_{j,k}$, write word line WWL$_j$ is connected to the gates of pass transistors 15a, 15b, and is asserted only in write cycles to row j, by way of which storage nodes SNT, SNB are connected to complementary write bit lines WBLT$_k$, WBLB$_k$ for column k. In a write to cell 12'$_{j,k}$, write circuitry (not shown) pulls one of write bit lines WBLT$_k$, WBLB$_k$ to ground, depending on the data state being written into cell 12'$_{j,k}$.

The read buffer of 8-T cell 12'$_{j,k}$ includes n-channel transistors 16n, 18n, which have their source-drain paths connected in series between read bit line RBL$_k$ and ground. Read buffer pass transistor 18n has its drain connected to read bit line RBL$_k$, and its gate receiving read word line RWL$_j$ for row j. Read buffer driver transistor 16n has its drain connected to the source of transistor 18n and its source at ground; the gate of transistor 16n is connected to storage node SNB. In a read of cell 12'$_{j,k}$, read word line RWL$_j$ is asserted active high, which turns on buffer pass transistor 18n. If the data state of storage node SNB is a "1"; then read bit line RBL$_k$ is pulled to ground by buffer driver transistor 16n through buffer pass transistor 18n. Conversely, if the data state of storage node SNB is a "0", transistor 16n remains off and read bit line RBL$_k$ is not pulled down. A sense amplifier (not shown) is capable of detecting whether read bit line RBL$_k$ is pulled to ground by the selected cell in column k, and in turn communicates that data state to I/O circuitry as appropriate.

In this 8-T construction, the pass transistors involved in the write cycle can have strong drive to provide good write margin, without affecting cell stability during read operations (because those pass transistors remain off). However, both the conventional 6-T cell of FIG. 1a and the conventional 8-T cell of FIG. 1b are vulnerable to unintentional change of state during the writing of data to other cells. More specifically, it has been observed that SRAM cells in unselected columns of selected rows (i.e., "half-selected" cells) are especially vulnerable to the "disturb" condition present on their bit lines during writes to cells in the same row. This disturb situation will now be described in connection with FIG. 1c.

FIG. 1c illustrates an example of a conventional interleaved array 19 of conventional 8-T SRAM cells 12', as described above relative to FIG. 1b. In the arrangement of FIG. 1c, a pair of write bit lines and a read bit line (not shown in FIG. 1c) are shared by each column of SRAM cells 12', and extend between precharge/equalization circuitry 22 and column select multiplexers 23, with SRAM cells 12' in that column connected to those bit lines in the manner described above relative to FIG. 1b. SRAM cells 12' are also arranged in rows, with each row of cells 12' sharing one of read word lines RWL0 through RWL3, and one of write word lines WWL0 through WWL3. In a read cycle, one of read word lines RWL0 through RWL3 is driven active by a row decoder and word line driver (not shown), in response to a row address value. Similarly, in a write cycle, the one of write word lines WWL0 through WWL3 corresponding to the row address is driven active by the row decoder and word line driver.

The architecture shown in FIG. 1c is referred to as interleaved, in that the columns are grouped such that the addressing of a data word selects one column in each group of columns, along the selected row. In this example, one group of four columns is shown, such that a given column address value selects one column from each group. Of course, array 19 will typically include more than the four columns and three rows of SRAM cells 12' shown in FIG. 1c. This interleaving is accomplished, in this conventional architecture, by column select multiplexer 23 associated with the four adjacent columns of cells 12' of FIG. 1c. Column select multiplexers 23 selects one column from its group of four in response to the state of the least significant two column address bits CA[1:0], as applied by column decode circuitry (not shown). The column selected by column select multiplexer 23 is placed in communication with read/write circuit 25. In this architecture, read/write circuit 25 is connected to a corresponding input/output line D/Q, as shown. Typical interleaved architectures will include multiple column select multiplexers 23 and read/write circuits 25, to accommodate the number of columns present in array 19 (arranged in groups of four columns, in this example).

FIG. 1c illustrates an example of a write cycle being applied to SRAM cell 12'[SEL] in array 19. In this example, selected SRAM cell 12'[SEL] is in the row associated with write word line WWL1, in the fourth column in the group of columns associated with read/write circuit 25 (i.e., column address bits CA[1:0] both carry a "1" logic level). Other cells 12' [HS] that are in this same row associated with write word line WWL1, but that are in the unselected columns, are referred to as "half-selected". During a write to selected SRAM cell 12'[SEL], pass transistors 15a, 15b (FIG. 1b) for each of these half-selected cells 12'[HS] will be turned on by write word line WWL1, connecting their respective storage nodes SNT, SNB to the unselected write bit lines WBLT, WBLB. However, because these columns are not selected for the write cycle, neither of those write bit lines WBLT, WBLB for the half-selected columns will be driven low by read/write circuit 25, but will remain floating at its precharged voltage.

It has been observed that this half-selection can upset the stored state of half-selected cells 12'[HS]. The initial high voltage at the one of the floating bit lines coupled to the "0" state storage node injects DC noise current at that storage node, which tends to pull up the voltage at that storage node from its initial "0" level, for example to about 20 to 30% of power supply voltage $V_{dda}$. This effect can upset the stored data state, particularly for half-selected cells in which the transistors are imbalanced due to process variations. In addition, noise of sufficient magnitude coupling to the bit lines of the half-selected columns, during a write to the selected columns in the same row, can cause a false write of data to those half-selected columns. In effect, such write cycle noise can be of sufficient magnitude as to trip the inverters of one or more of the half-selected cells 12' [HS]. The possibility of such stability failure is exacerbated by device mismatch and variability, as discussed above.

In conventional SRAM cells such as 6-T SRAM cell 12 of FIG. 1a and 8T SRAM cell 12' of FIG. 1b, the designer is therefore faced with a tradeoff between cell stability on one hand, and write margin on the other. In a general sense, cell stability is favored by pass transistors 15a, 15b having relatively weak drive as compared with load transistors 13 and driver transistors 14, because this results in weak coupling between the bit lines and storage nodes and relatively strong drive of the latched state at storage nodes SNT, SNB. Conversely, write margin is favored by pass transistors 15a, 15b having relatively strong drive as compared with load transistors 13 and driver transistors 14, because this enables strong coupling between the bit lines and storage nodes, resulting in storage nodes SNT, SNB having weak resistance to changing state. Accordingly, the design of conventional 6-T SRAM cells 12 and 8-T SRAM cells 12' involves a tradeoff between these two vulnerabilities.

Unfortunately, the design window in which both adequate cell stability and adequate write margin can be attained is becoming smaller with continued scaling-down of device feature sizes, for the reasons mentioned above. In addition, it has been observed that the relative drive capability of p-channel MOS transistors relative to re-channel MOS transistors is increasing as device feature sizes continue to shrink, which skews the design window toward cell stability over write margin.

By way of further background, the 8-T concept described in connection with FIG. 1b is further extended, in some conventional SRAM memories, to provide complementary read bit lines, supporting differential sensing of the stored data state in a read cycle. An example of this extended structure is illustrated by way of cell $12''_{j,k}$ shown in FIG. 1d. Cell $12''_{j,k}$ includes the eight transistors of cell $12'_{j,k}$ shown in FIG. 1b, but also includes transistors $16n'$, $18n'$ that forward the data state at storage node SNT to complementary read bit line $RD\_BLB_k$, in similar fashion as transistors $16n$, $18n$ forward the state at storage node SNB to read bit line $RD\_BLT_k$. In a read cycle, enabled by read word line $RD\ WL_j$ driven active high, which turns on transistors $18n$, $18n'$, a differential signal is generated on read bit lines $RD\_BLB_k$, $RD\_BLT_k$ according to the states at storage nodes SNT, SNB. SRAM cells constructed as shown in FIG. 1c are referred to in the art as "10-T" cells. However, because pass transistors 15a, 15b are turned on for unselected columns in selected row j, cell $12''_{j,k}$ also suffers from the cell stability, or disturb vulnerability, described above.

By way of further background, my copending and commonly assigned U.S. patent application Ser. No. 12/827,706, filed Jun. 24, 2010, entitled "Bit-by-Bit Write Assist for Solid-State Memory", describes a solid-state memory in which write assist circuitry is implemented within each memory cell. As described in this application, each memory cell includes a pair of power switch transistors that selectably apply bias (either power supply voltage $V_{dd}$ or ground) to the inverters of the memory cell. One of the power switch transistors is gated by a word line indicating selection of the row containing the cell, and the other is gated by a column select signal indicating selection of the column containing the cell in a write cycle. Upon a write to the cell, both power switch transistors are turned off, removing bias from the inverter. With bias removed from the inverters, the writing of an opposite cell state is facilitated.

By way of further background, my copending and commonly assigned U.S. patent application Ser. No. 12/834,914, filed Jul. 13, 2010, entitled "Memory Cell with Equalization Write Assist Solid-State Memory", describes a solid-state memory in which equalization transistors are included within each memory cell. In each selected memory cell in a write cycle, those equalization transistors are turned on to short the storage nodes to one another. The bit line driven by the write circuitry can then more readily define the state of the cross-coupled inverters, by eliminating the tendency of those inverters to maintain the previously stored latch state.

By way of further background, my copending and commonly assigned U.S. patent application Ser. No. 13/104,735, filed May 10, 2011, entitled "Solid-State Memory Cell with Improved Read Stability", describes a solid-state memory in which an isolation gate, for example realized by parallel-connected complementary MOS transistors, is included within each memory cell. The isolation gate within an SRAM cell is connected between the input to one of the cross-coupled inverters and the opposite storage node. As described in that copending application, the isolation gate is turned off in read cycles, and for unselected columns in write cycles. The isolation gate, when turned off, eliminates modulation at one of the storage nodes from affecting the state of the opposite inverter, breaking the feedback loop for bit line noise and inhibiting stability failures.

By way of further background, Takeda et al., "A Read-Static-Noise-Margin-Free SRAM Cell for Low-VDD and High-Speed Applications", *J. Solid-State Circuits*, Vol. 41, No. 1 (IEEE, January 2006), pp. 113-21, describes a seven-transistor (7-T) SRAM cell in which an additional transistor is included in series with one of the inverters, and is gated by the word line. The inverter that includes the extra series transistor has its common drain node coupled to its bit line only in write cycles (i.e., by a "write word line"); the opposing inverter drives its bit line in read cycles. This single-ended read limits the number of cells that can connect to the same bit line, because of the reduced read signal strength. The chip area efficiency is thus impacted by that constraint, and also because of the three separate word lines that must now be routed to each cell. In addition, the asymmetric layout of the 7-T cell precludes implementation in an interleaved array architecture, increasing the likelihood of multiple-bit soft errors, and further reducing chip area efficiency.

By way of further background, FIG. 1e illustrates an example of conventional SRAM cell $12'''$ of the "cross-point" type. The "cross-point" nomenclature refers to the requirement that both a word line and a column select line be energized to couple storage nodes SNT, SNB to bit lines BLT, BLB, respectively. Cell $12'''$ is constructed similarly as 6-T SRAM cell described above relative to FIG. 1a, except that pass transistors 15a, 15b are arranged in series with a corresponding pass transistor 17a, 17b, respectively. More specifically, the source-drain paths of pass transistors 15a, 17a are connected in series between storage node SNT and bit line BLT, and the source-drain paths of pass transistors 15b, 17b are connected in series between storage node SNB and bit line BLB. The gates of pass transistors 15a, 15b are driven by word line WL, as before. The gates of pass transistors 17a, 17b are driven by column select line CS, as may be driven by a column select or column decoder circuit in the memory function.

BRIEF SUMMARY OF THE INVENTION

Embodiments of this invention provide a memory cell, and method of operating the same, in which cell stability is improved and disturb vulnerability is eliminated without impacting write margin.

Embodiments of this invention provide such an array and method in which design constraints on the memory cells can be skewed to favor write margin without sacrificing cell stability.

Embodiments of this invention provide such an array and method that enables reduction in the array power supply voltage without sacrificing cell stability.

Embodiments of this invention provide such an array and method that are compatible with implementation in low voltage, near threshold (or sub-threshold), applications such as ultra low power devices.

Other objects and advantages of embodiments of this invention will be apparent to those of ordinary skill in the art having reference to the following specification together with its drawings.

This invention may be implemented into a static random access memory (SRAM) cell including a storage element with two complementary latched storage nodes and a read buffer gated by a read word line, and including a write element for setting the latched state of the cell in write cycles. Complementary write bit lines for a given column control the conduction path of corresponding pass transistors connected between respective storage nodes and a write select transistor. The write select transistor is gated by a write word line associated with the row of the SRAM cell. In a write cycle to the cell, one of the write bit lines for its column and the write word line for its row are energized, which connects one of the storage nodes to a write reference voltage, setting the state of the cell. In read cycles, the write word line and the write bit lines remain inactive, isolating the storage nodes from the write voltages. The cell includes a single-ended or a differential read buffer, for communicating the stored state to a read bit line for the column.

DETAILED DESCRIPTION OF THE INVENTION

This invention will be described in connection with its embodiments, namely as implemented into a static random access memory (SRAM) embedded within a larger scale integrated circuit, and constructed according to complementary metal-oxide-semiconductor (CMOS) technology, because it is contemplated that this invention is especially beneficial in such an application. However, it is contemplated that those skilled in the art having reference to this specification will readily recognize that this invention may be applied to a wide range of memory devices. Accordingly, it is to be understood that the following description is provided by way of example only, and is not intended to limit the true scope of this invention as claimed.

Figure 1A:
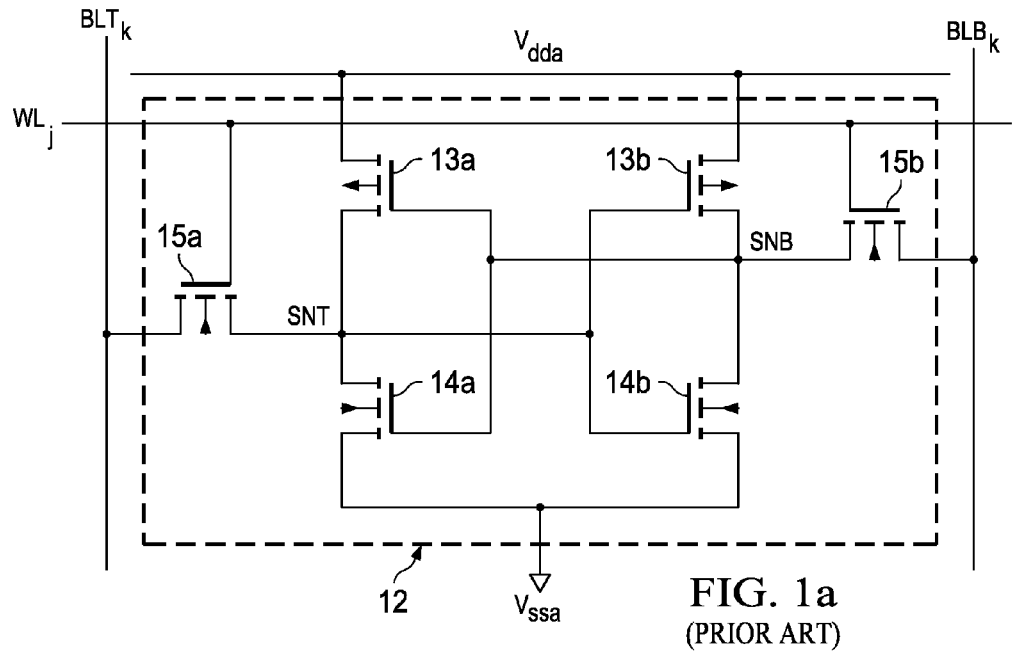
FIG. 1a is an electrical diagram, in schematic form, of a conventional 6-transistor static random access memory (SRAM) cell.
Figure 1B:
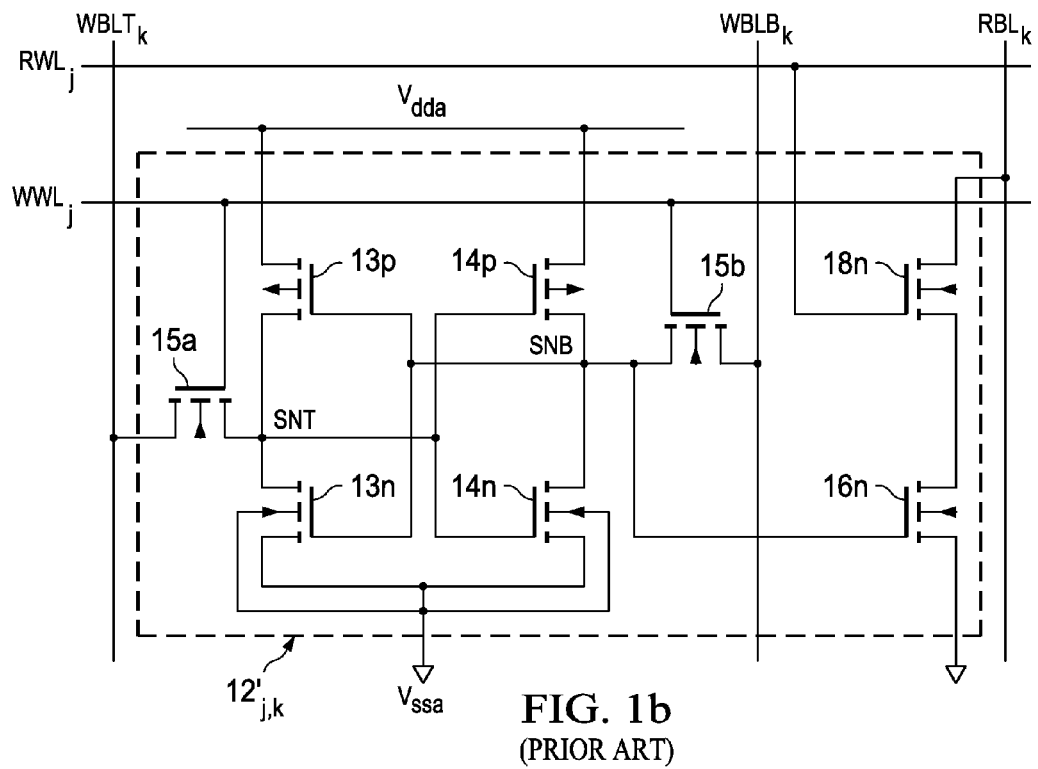
FIG. 1b is an electrical diagram, in schematic form, of a conventional 8-transistor SRAM cell.
Figure 1C:
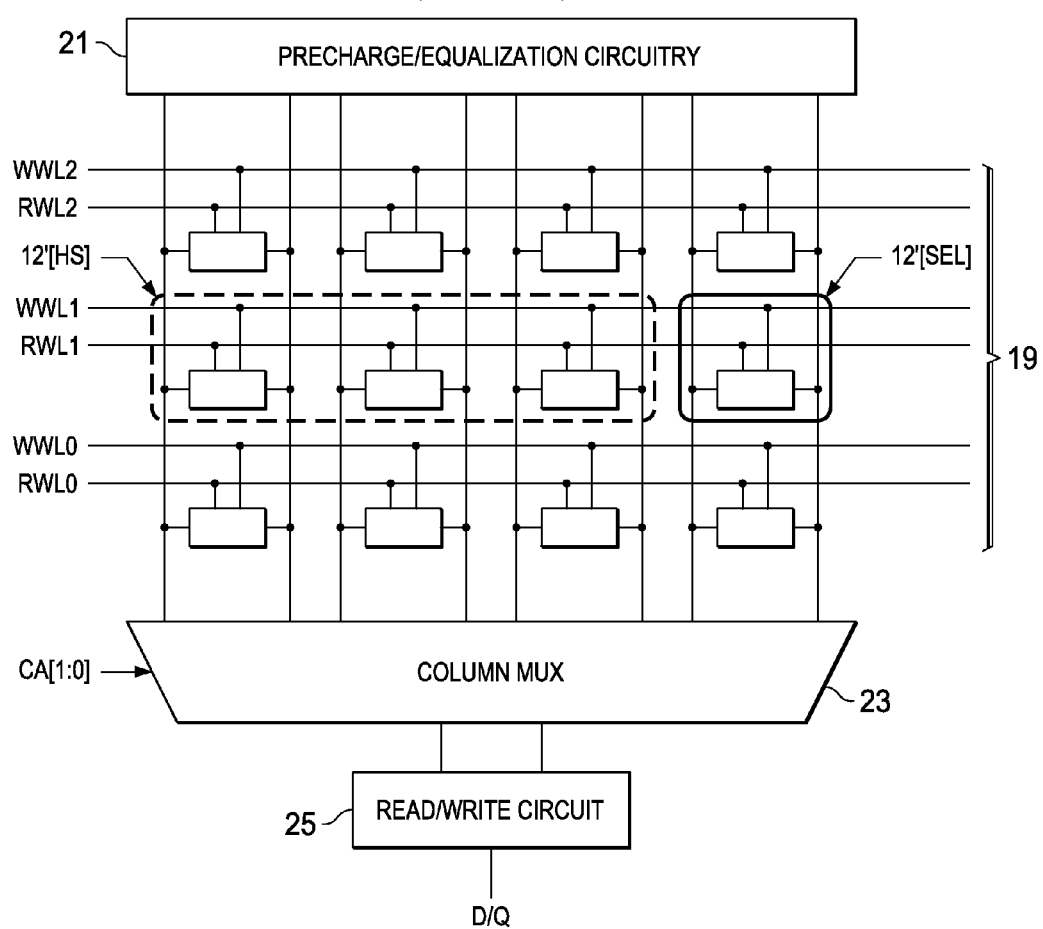
FIG. 1c is an electrical diagram, in block form, of a portion of an SRAM in a conventional interleaved architecture.
Figure 1D:
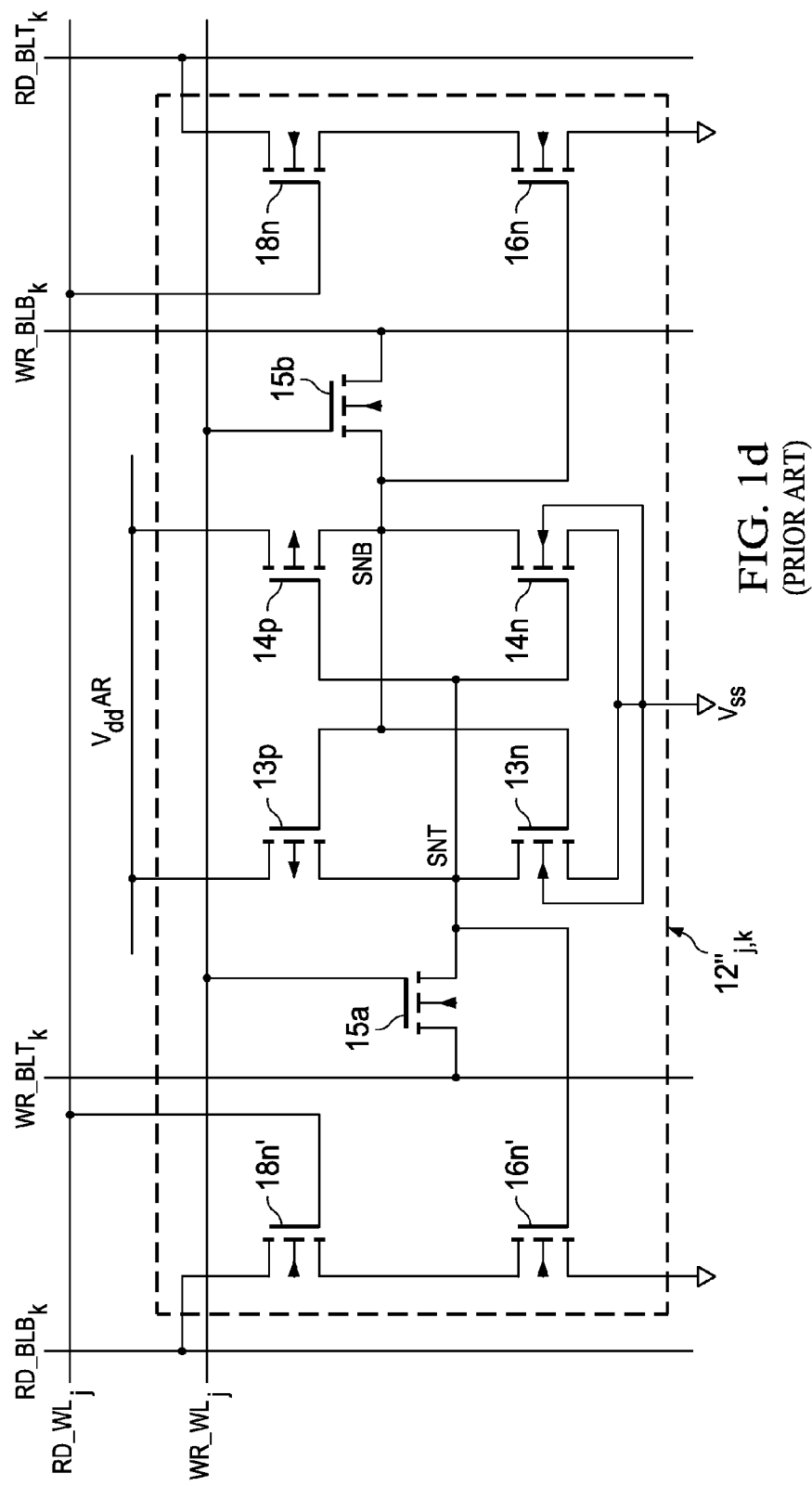
FIG. 1d is an electrical diagram, in schematic form, of a conventional 10-transistor SRAM cell.
Figure 1E:
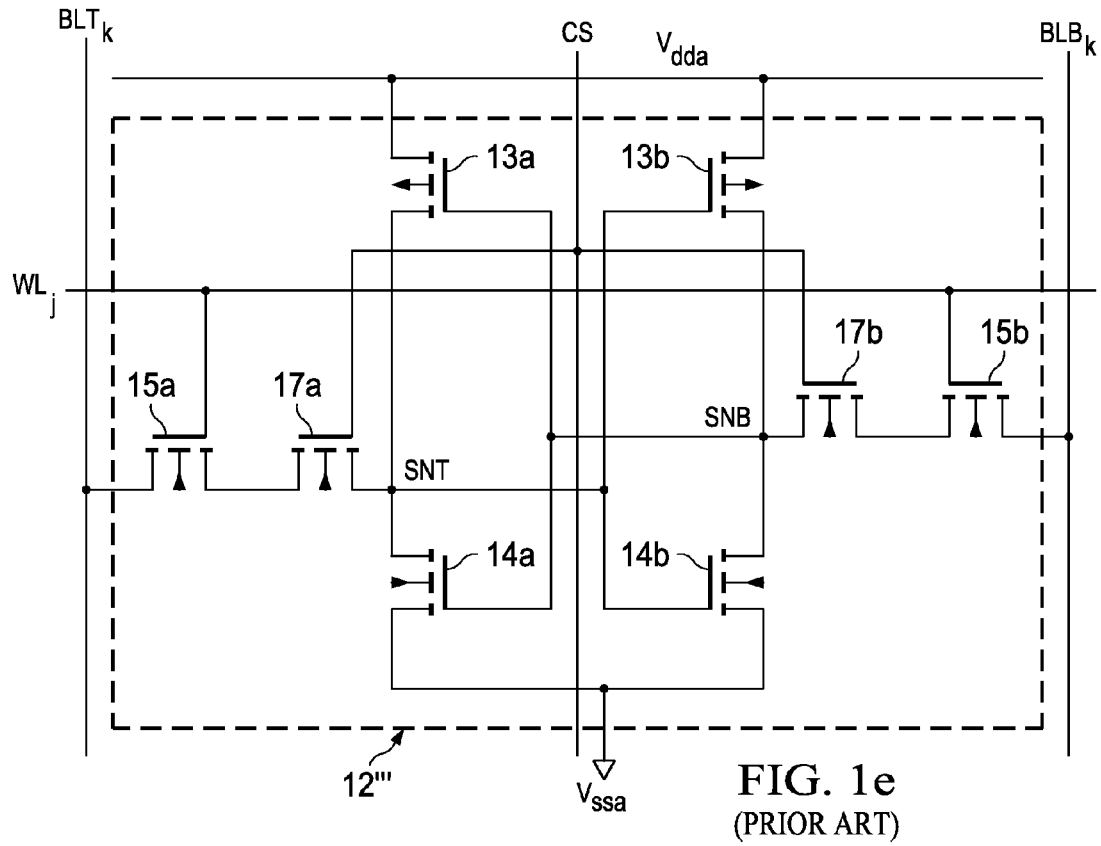
FIG. 1e is an electrical diagram, in schematic form, of a conventional cross-point SRAM cell.
Figure 2:
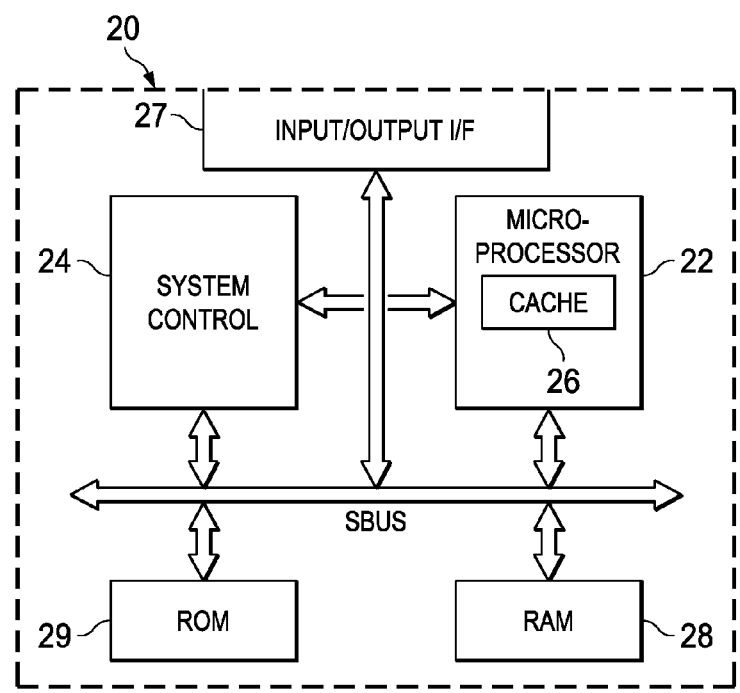
FIG. 2 is an electrical diagram, in block form, of a large scale integrated circuit constructed according to embodiments of the invention.

FIG. 2 illustrates an example of large-scale integrated circuit 20, in the form of a so-called "system-on-a-chip" ("SoC"), as now popular in many electronic systems. Integrated circuit 20 is a single-chip integrated circuit into which an entire computer architecture is realized. As such, in this example, integrated circuit 20 includes a central processing unit of microprocessor 22, which is connected to system bus SBUS. Various memory resources, including random access memory (RAM) 28 and read-only memory (ROM) 29, reside on system bus SBUS and are thus accessible to microprocessor 22. Typically, ROM 29 serves as program memory, storing the program instructions executable by microprocessor 22, while RAM 28 serves as data memory; in some cases, program instructions may reside in RAM 28 for recall and execution by microprocessor 22. Cache memory 26 (such as level 1, level 2, and level 3 caches, each typically implemented as SRAM) provides another memory resource, and resides within microprocessor 22 itself and therefore does not require bus access. Other system functions are shown, in a generic sense, in integrated circuit 20 by way of system control 24 and input/output interface 27.

Those skilled in the art having reference to this specification will recognize that integrated circuit 20 may include additional or alternative functions to those shown in FIG. 2, or may have its functions arranged according to a different architecture from that shown in FIG. 2. The architecture and functionality of integrated circuit 20 is thus provided only by way of example, and is not intended to limit the scope of this invention.

Figure 3:
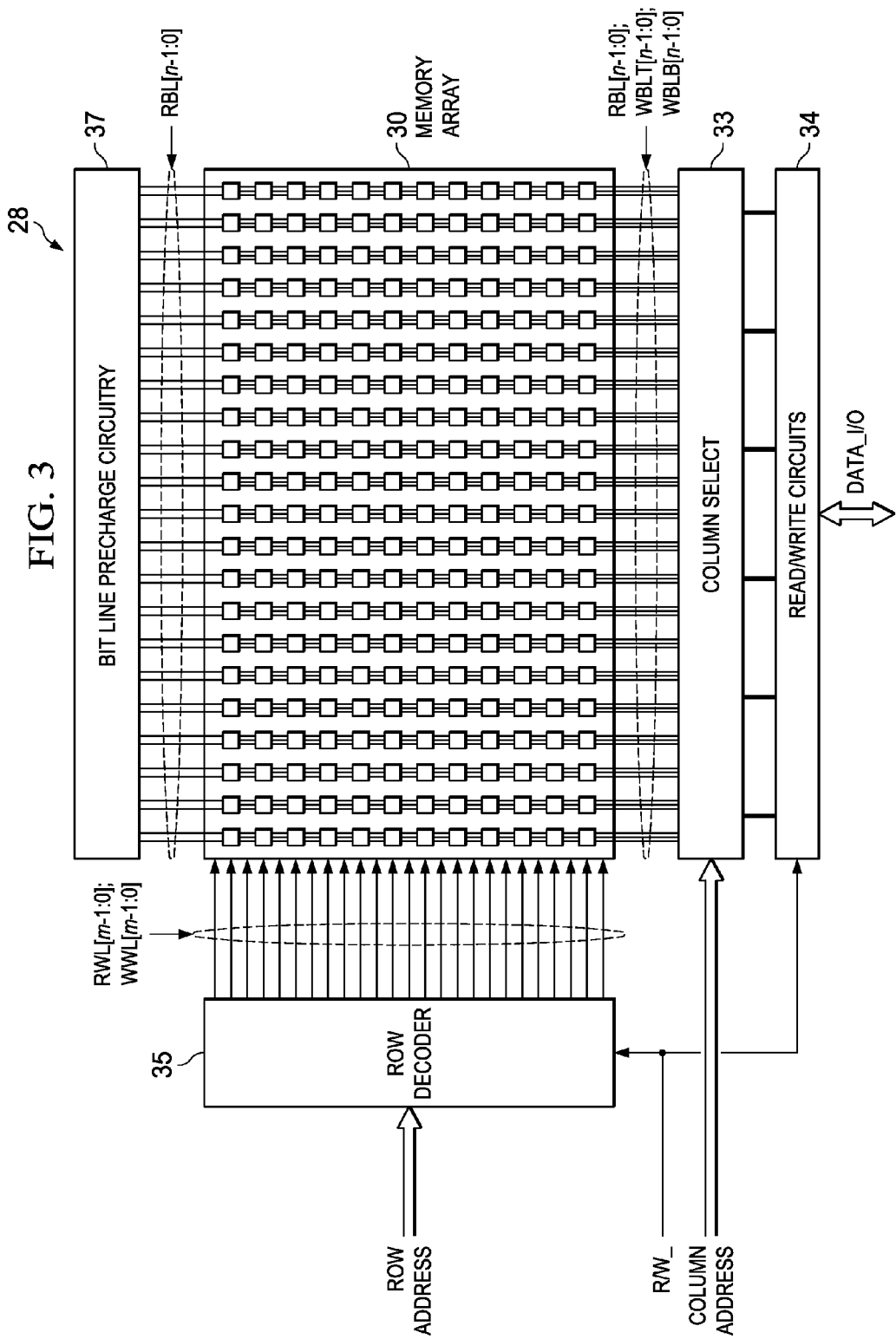
FIG. 3 is an electrical diagram, in block form, of a memory in the integrated circuit of FIG. 2, constructed according to an embodiment of the invention.

Further detail in connection with the construction of RAM 28 in integrated circuit 20 is illustrated in FIG. 3. Of course, a similar construction may be used to realize other memory resources such as cache memory 26; further in the alternative, RAM 28 may correspond to a stand-alone memory integrated circuit (i.e., rather than as an embedded memory as shown in FIG. 2). Those skilled in the art having reference to this specification will comprehend that the memory architecture of RAM 28 in FIG. 3 is provided by way of example only.

In this example, RAM 28 includes many memory cells arranged in rows and columns within memory array 30. While a single instance of memory array 30 is shown in FIG. 3, it is to be understood that RAM 28 may include multiple memory arrays 30, each corresponding to a memory block within the address space of RAM 28. The construction of these memory cells according to embodiments of this invention will be described in further detail below. In this example, memory array 30 includes m rows and n columns of SRAM cells, with cells in the same column sharing at least one read bit line RBL[n-1:0] and a pair of write bit lines WBLT[n-1:0], WBLB [n-1:0], and with memory cells in the same row sharing a read word line RWL[m-1:0] and a write word line WWL[m-1:0]. Bit line precharge circuitry 37 is provided to apply a desired precharge voltage to read bit lines RBL[n-1:0] in advance of read cycles; optionally, depending on the manner of operation, write bit lines WBLT[n-1:0], WBLB[n-1:0]) may also be precharged prior to write cycles. Row decoder 35 receives a row address value indicating the row of memory array 30 to be accessed, and also receives read/write control signal R/W_. In read cycles (e.g., read/write control signal R/W_active high), row decoder 35 energizes the one of read word lines RWL[m-1:0] corresponding to that row address value; conversely, in write cycles (e.g., read/write control signal R/W inactive low), row decoder 35 energizes the one of write word lines WWL[m-1:0] corresponding to the row address value. Column select circuit 33 receives a column address value, and in response selects the read bit lines RBL[n-1:0] or write bit lines WBLT[n-1:0], WBLB[n-1:0] (in read and write cycles, respectively) associated with the one or more columns indicated by the column address, for communication with read/write circuits 34. In this embodiment of the invention, column select 33 receives the two least significant bits of the column address, and selects the bit line or bit lines for one column out of each group of four adjacent columns. In this "interleaved" architecture, a given memory address selects one of every x (e.g., one of every four) columns for read or write access. The data words stored in memory array 30 are thus interleaved with one another.

Read/write circuits 34, which may be realized as conventional sense amplifiers and write circuits as known in the art for SRAM devices, are in communication with bus DATA_I/O, by way of which output data and input data are communicated from and to the addressed memory cells within memory array 30, in the conventional manner. In particular, it is contemplated that those skilled in the art having reference to this specification will be readily able to construct the appropriate read/write circuits 34 for RAM 28 to carry out the particular operations involved in read and write cycles, in the manner described below.

The construction of memory cells arranged in memory array 30, according to one embodiment of this invention, will now be described in connection with FIG. 4. This construction will be described using, by way of example, SRAM cells formed of cross-coupled CMOS inverters, because it is contemplated that this invention is especially beneficial when used in connection with such memory cells. However, it is also contemplated that embodiments of this invention will provide important benefits in memories of other types, such as SRAM cells with resistor loads, ferroelectric static RAM (FeRAM) cells based on cross-coupled inverters, and the like. It is contemplated that those skilled in the art having reference to this specification will be readily able to apply embodiments of this invention to advantage in connection with such other memory cell types and technologies.

Figure 4:
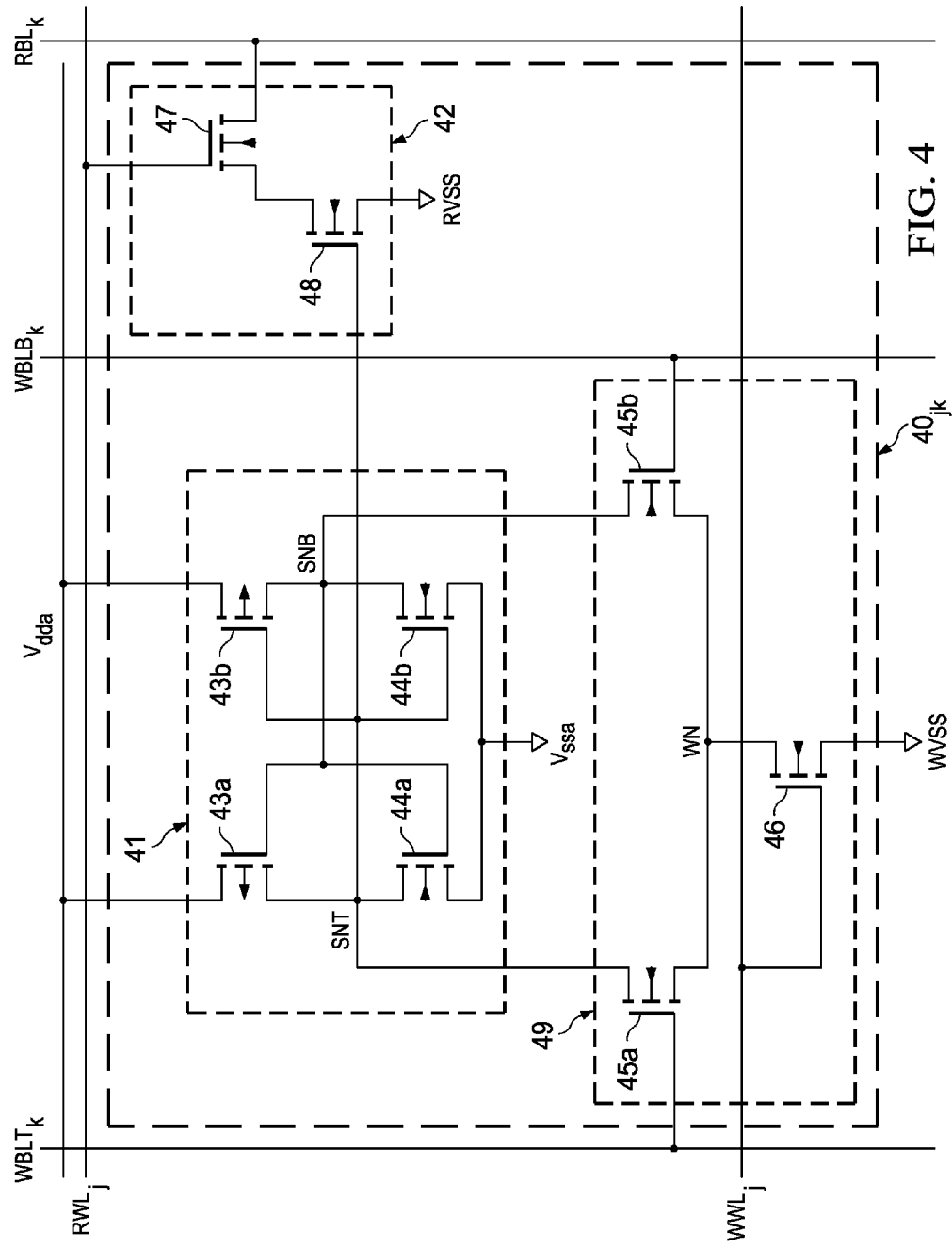
FIG. 4 is an electrical diagram, in schematic form, of a memory cell in the memory of FIG. 3 according to an embodiment of the invention.

FIG. 4 illustrates the construction of SRAM cell $40_{jk}$ according to embodiments of this invention. In this construction, SRAM cell $40_{jk}$ includes storage element 41, formed by a pair of cross-coupled CMOS inverters. As shown in FIG. 4, one inverter is formed by p-channel MOS load transistor 43a and n-channel MOS driver transistor 44a, which have their drains connected together at storage node SNT and their gates connected together. The source of load transistor 43a is connected to array power supply node $V_{dda}$, and the source of driver transistor 44a is connected to array ground, or reference, node $V_{ssa}$. The other inverter in SRAM cell $40_{jk}$ consists of p-channel MOS load transistor 43b and n-channel MOS driver transistor 44b. The drains of transistors 43b, 44b are connected together at storage node SNB and to the gates of transistors 43a, 44a, and the gates of transistors 43b, 44b are connected together and connected to storage node SNT, in the usual manner for cross-coupled inverters in an SRAM cell. The source of transistor 43b is at array power supply node $V_{dda}$ and the source of transistor 44b is at array ground node $V_{ssa}$. In this embodiment of the invention, storage nodes SNT and SNB constitute latched complementary storage nodes in SRAM cell $40_{jk}$, in that when SRAM cell $40_{jk}$ is not being accessed, their logic states are complementary to each other (one at a logic "0" and the other at a logic "1").

When deployed in a memory architecture such as that described above relative to FIG. 3, SRAM cell $40_{jk}$ corresponds to the memory cell in row j and column k of that memory array 30. According to this embodiment of the invention, SRAM cell $40_{jk}$ includes read buffer 42, which includes n-channel MOS pass transistor 47 with its source/drain conduction path connected between read bit line $RBL_k$ (for column k in memory array 30) and the drain of n-channel MOS driver transistor 48. Driver transistor 48 has its source connected to read ground level RVSS (which may be at the same voltage as array ground $V_{ssa}$, or may differ), and its gate connected to storage node SNT. The gate of pass transistor 47 is connected to receive read word line $RWL_j$ for row j within which SRAM cell $40_{jk}$ resides. In operation during a read cycle, bit line $RBL_k$ is first precharged by precharge circuitry 37, and then floats. Upon energizing of read word line $RWL_j$ in response to the memory address including a row portion selecting row j of memory array 30, pass transistor 47 in SRAM cell $40_{jk}$ is turned on. The logic state at storage node SNT determines whether driver transistor is turned on (for a "1" at storage node SNT) to pull read bit line $BLT_k$ toward read ground level RVSS, or turned off (for a "0" at storage node SNT) such that read bit line $BLT_k$ remains at its precharged level.

According to this embodiment of the invention, SRAM cell $40_{jk}$ includes separate write element 49 operating in a "cross-point" manner, in that a write is performed to SRAM cell $40_{jk}$ in response to the combination of a row address-dependent signal (write word line $WWL_j$) indicating row j and a column address-dependent signal (write bit lines $WBLT_k$, $WBLB_k$) indicating column k. Write element 49 in this example of the invention includes write select transistor 46, which is an n-channel MOS transistor having its source connected to write ground level WVSS (which may be at the same voltage as array ground $V_{ssa}$ or read ground level RVSS, or may differ therefrom) and write node WN; the gate of write select transistor 46 receives write word line $WWL_j$. N-channel MOS write pass transistors 45a, 45b each have their sources connected at write node WN (at the drain of write select transistor 46). The drain of write pass transistor 45a is connected to storage node SNT, and the gate of write pass transistor 45a is connected to receive write bit line $WBLT_k$. Conversely, the drain of write pass transistor 45b is connected to storage node SNB, and the gate of write pass transistor 45b is connected to receive write bit line $WBLB_k$. Write bit lines $WBLT_k$, $WBLB_k$ are controlled by read/write circuitry 34 to either both be inactive at a low level (i.e., in read cycles, in standby, or in write cycles to columns other than column k), or at complementary logic levels (i.e., in write cycles to column k). Accordingly, transistors 45a and 46 pull storage node SNT to write ground level WVSS in response to row j being selected for a write cycle (write word line $WWL_j$ at a high level), and in response to write bit line $WBLT_k$ being driven high; conversely, transistors 45b and 46 pull storage node SNB to write ground level WVSS in response to row j being selected for a write cycle (write word line $WWL_j$ at a high level) in combination with write bit line $WBLB_k$ being driven high.

Figure 5:
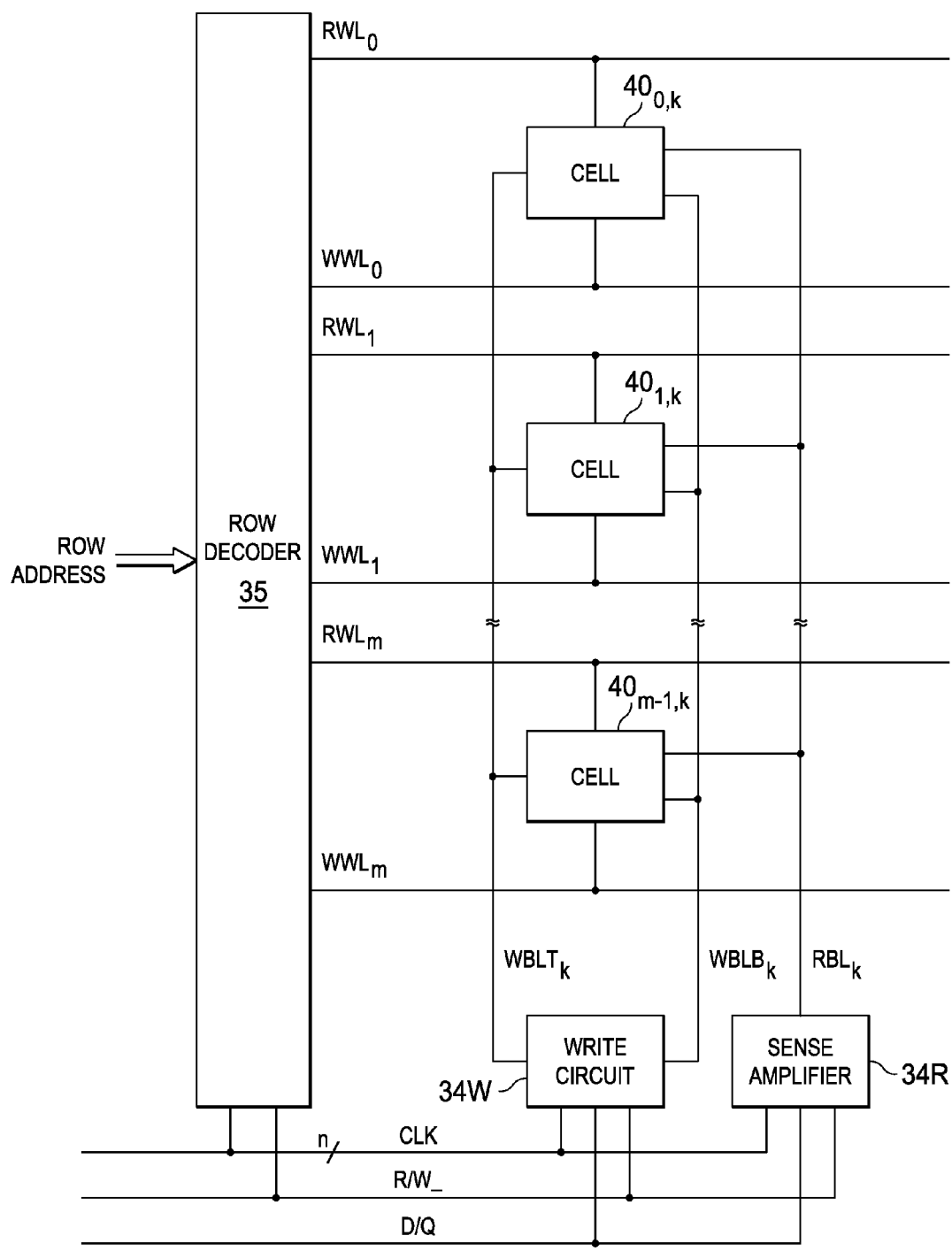
FIG. 5 is an electrical diagram, in block form, of a column in the memory of FIG. 3 and its corresponding peripheral circuitry.

FIG. 5 illustrates a generalized architecture of RAM 28 for its column k, by way of example. As shown in this FIG. 5, column k includes SRAM cells $40_{0,k}$ through $40_{m-1,k}$, each of which are coupled to receive write bit lines $WBLT_k$, $WBLB_k$, and to drive read bit line $RBL_k$. Each cell $40_{j,k}$ in column k receives read word line $RBL_j$ and write word line $WBL_j$ for its row j. The peripheral circuitry of RAM 28 is also shown in FIG. 5 in a generalized fashion. Row decoder 35 receives the row portion of the memory address and also read/write control signal R/W_, and issues either read word line $RWL_j$ or write word line $WWL_j$ for the row indicated by that row address, depending on the state of read/write control signal R/W_. The selected one of read word line $RWL_j$ or write word line $WWL_j$ is issued by row decoder 35 at the appropriate time in the cycle, as controlled by one or more clock signals CLK issued by the corresponding control circuitry of RAM 28 in the conventional manner.

On the column side, write circuit 34W is coupled to write bit lines $WBLT_k$, $WBLB_k$, via column select circuit 33 (not shown) of FIG. 3. Write circuit 34W is constructed of the appropriate logic circuitry for applying complementary logic levels upon write bit lines $WBLT_k$, $WBLB_k$ at the appropriate time (under the control of one or more clock signals CLK) within a write cycle (as indicated by read/write control signal R/W_), and depending on the desired input data state indicated at input/output line D/Q. Conversely, sense amplifier 34R is coupled to read bit line $RBL_k$ (via column select circuit 33 (not shown) in the architecture of FIG. 3). Sense amplifier 34R in this example is a conventional sense amplifier for single-ended sensing of the level at read bit line $RBL_k$, and is controlled to perform such sensing and amplification at the appropriate time (under the control of one or more clock signals CLK) within a read cycle (as indicated by read/write control signal R/W_). The sensed data state, as amplified by sense amplifier 34R is then driven onto input/output line D/Q.

Figure 6:
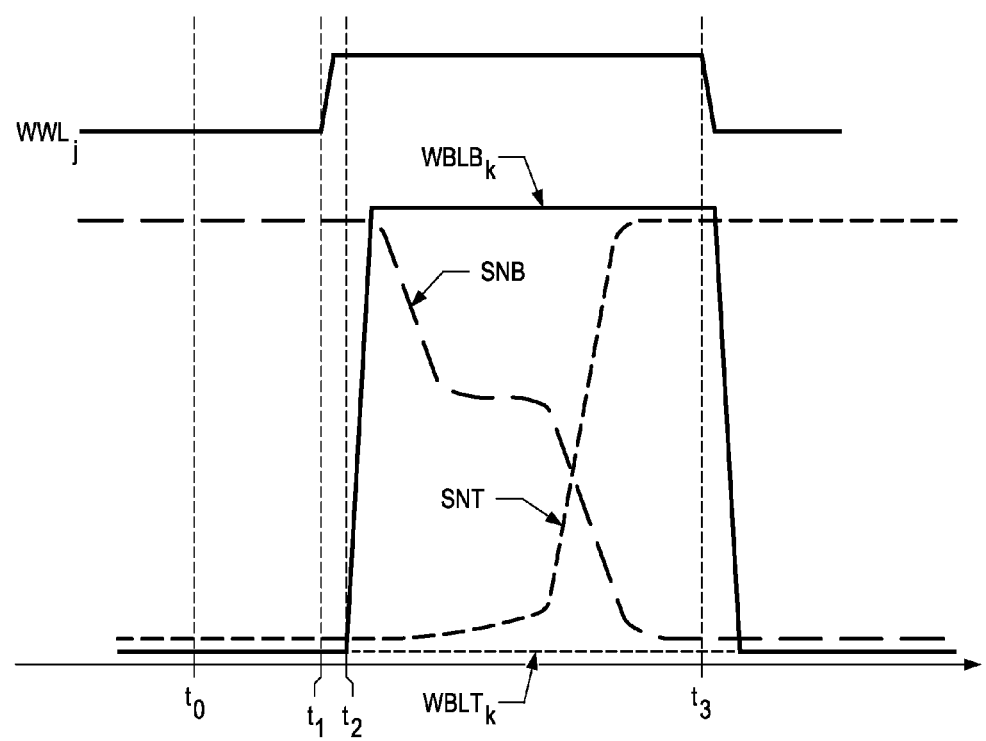
FIG. 6 is a timing diagram illustrating the operation of an example of a write cycle to the memory cell of FIG. 4 according to that embodiment of the invention.

FIG. 6 illustrates the generalized timing of an example of a write cycle to SRAM cell $40_{jk}$ according to this embodiment of the invention. More particularly, FIG. 6 illustrates the case in which SRAM cell $40_{jk}$ of FIG. 4 is previously storing a "0" data state (i.e., storage node SNT is at a low "0" level, and storage node SNB is at a high "1" logic level), and in which SRAM cell $40_{jk}$ is then written to a "1" state.

At the beginning of the cycle shown in FIG. 6, for example at time $t_0$, storage node SNT is at a low "0" level and storage node SNB is at a high "1" level, consistent with the construction of storage element 51 as cross-coupled inverters. Write word line $WWL_j$ is at a low logic level, maintaining write select transistor 46 off; at this point of the write cycle, write bit lines $WBLT_k$, $WBLB_k$ are both held at a low level by write circuit 34W. Read word line $RWL_j$ (not shown) is held low by row decoder 35, and will remain at that level throughout the write cycle of FIG. 6.

In this example of a write cycle in which SRAM cell $40_{jk}$ is in a selected row j and a selected column k, write word line $WWL_j$ is energized to a high logic level at time $t_1$. In this example, shortly after the transition of write word line $WWL_j$, write circuit 34W drives write bit line $WBLB_k$ to a high level in response to the selection of column k and to the input data state received at input/output line D/Q; write bit line $WBLT_k$ remains at a low logic level for this "1" data state. It is contemplated that the relative timing between the energizing of write word line $WWL_j$ and the driving of one of write bit lines $WBLT_k$, $WBLB_k$ is not of particular importance, considering the construction of write element 49 in each of SRAM cells 40 according to this embodiment of the invention. It is contemplated that the driving of one of write bit lines $WBLT_k$, $WBLB_k$ for the selected column k will typically be simultaneous with, or shortly before or after, the energizing of write word line $WWL_j$ for the selected row j.

In the example of FIG. 6, upon the transition of write bit line $WBLB_k$ at time $t_2$, the voltage at storage node SNB begins to be pulled down by transistors 45b, 46 of SRAM cell $40_{jk}$ (FIG. 4) both being turned on. As storage node SNB is pulled from its full "1" level, driver transistor 44a in the opposite inverter of storage element 41 will start to turn off, and load transistor 43a will start to turn on, causing the voltage at storage node SNT to slowly rise. The fall in the voltage at storage node SNB is contemplated to flatten in mid-cycle, until the voltage at storage node SNT rises to a level that causes the cross-coupled inverters of storage element 41 to quickly flip due to the feedback between those inverters. Storage node SNB then rapidly falls to the low "0" level and storage node SNT is rapidly pulled to the high "1" level. After sufficient time for storage element 41 to change its state in this manner, row decoder 35 de-energizes write word line $WWL_j$, at time $t_3$ in this example. The voltage at write bit line $WBLB_k$, for this data state in this cycle, is then pulled back to a ground level, typically after write word line $WWL_j$ is de-energized, as shown. The write cycle thus ends.

It is contemplated that those skilled in the art, having reference to this specification, will readily comprehend the operation of SRAM cell $40_{jk}$ in the write of the opposite data state, in read cycles, and in other typical SRAM operations. It is further contemplated that those skilled artisans will also be able to readily implement the appropriate peripheral circuitry, including row decoder, column select, read circuits, and write circuits, and the like, for carrying out the appropriate SRAM operations as suitable for the memory cells of embodiments of this invention, as suitable for particular implementations.

Referring back to FIG. 4, it has been observed, through simulation, that the "charge sharing" within SRAM cell $40_{jk}$ at write node WN in successive memory cycles is very low, and generally insufficient to cause a cell error. For example, write node WN of SRAM cell $40_{jk}$ may retain a high voltage following a write cycle to a cell in its column k but in a row other than its row j, due to one of write pass transistors 45a, 45b having been turned on by the corresponding write bit line. If, for example, SRAM cell $40_{jk}$ is storing a "0" level at storage node SNT, and a next cycle is a write to another cell in column k but in a different row than row j with the data state causing write bit line $WBLT_k$ to go to a high level, that retained high voltage at wrote node WN will be coupled to the "0" level at storage node SNT, potentially causing a disturb of the stored data state. However, it has been observed, through simulation of a modern implementation of SRAM cell $40_{jk}$, that this charge sharing will cause at most a slight ripple at storage node SNT, well short of the trip voltage of storage element 41. The converse condition, in which a retained low voltage at write node WN is coupled to a "1" level storage node, similarly causes only a slight ripple in the storage node voltage.

Furthermore, it has been observed, also through simulation, that SRAM cell $40_{jk}$ according to the embodiment of the invention shown in FIG. 4 exhibits an extremely large write margin. More specifically, at a nominal power supply voltage of 0.9 volts, a write margin of on the order of 250 mV has been observed.

According to this embodiment of the invention, as evident from FIG. 4, SRAM cell $40_{jk}$ is constructed in a manner that is essentially disturb-free, in that storage nodes SNT, SNB are not coupled to any bit lines in any cycle that does not specifically select its own row and its own column. In other words, SRAM cell $40_{jk}$ cannot be "half-selected". In those write cycles in which column k is not selected, both of transistors 45a, 45b will both be turned off, and as such storage nodes SNT, SNB will be isolated from write bit lines $WBLT_k$, $WBLB_k$. And for read cycles, storage node SNT is coupled only to the gate of driver transistor 48 in read buffer 42, and is therefore not subject to charge sharing with read bit line $RBL_k$ nor is otherwise vulnerable to a disturb situation. These properties of SRAM cell $40_{jk}$ allow optimization of the construction of the various transistors within SRAM cell $40_{jk}$. For example, because the state of SRAM cell $40_{jk}$ effectively cannot be disturbed from bit lines, and because storage element 41 need not itself drive the read current (due to the construction of read buffer 42 including driver transistor 48, which does drive the read current), transistors 43, 44 in storage element 41 can be optimized for low leakage and small chip area. For example, the threshold voltages of transistors 43, 44 can be relatively high as compared with logic and other switching transistors of integrated circuit 20, thus reducing array leakage. In addition, the low drive requirements placed on storage element 41 (i.e., no read current requirement) allows transistors 43, 44 to be fabricated as minimum channel width devices.

On the other hand, transistors 45, 46, 47, 48 of SRAM cell 40$_{jk}$ that are involved in the write and read of the state of storage element 41 can be fabricated to meet the desired performance, for example as relatively large (channel width) transistors with relatively low threshold voltages, as compared with storage element transistors 43, 44. More specifically, it is contemplated that transistors 45, 46 can be minimum size, low threshold voltage, logic transistors and still satisfy write margin and write speed requirements, while transistors 47, 48 can be larger low threshold voltage devices, sized just large enough to meet read speed requirements. These transistors 45, 46, 47, 48 thus can provide excellent drive current, and rapid switching performance, without affecting the stability of the state stored by storage element 41. Indeed, according to this embodiment of the invention, it is contemplated that write and read transistors 45, 46, 47, 48 can be optimized independently from transistors 43, 44 of storage element 41, thus providing the designer with additional degrees of freedom in the design and layout of RAM 28.

Despite the low threshold voltage of write transistors 45*a*, 45*b*, 46, leakage from storage nodes SNT, SNB to write ground level WVSS is very low, due to the "stacking" effect of two or more "off" state transistors in series presented by these write transistors 45*a*, 45*b*, 46. Because of this stacked construction, and because of the high threshold voltage of storage element transistors 43, 44, the voltage across storage element 41 (i.e., the differential voltage between array power supply voltage $V_{dda}$ and array ground $V_{ssa}$) can be reduced dramatically, as compared with conventional SRAM arrays. Indeed, it is contemplated that the operating voltage between array power supply voltage $V_{dda}$ and array ground $V_{ssa}$ can, in many applications, be maintained at a level close to the minimum data retention voltage.

Figure 7:
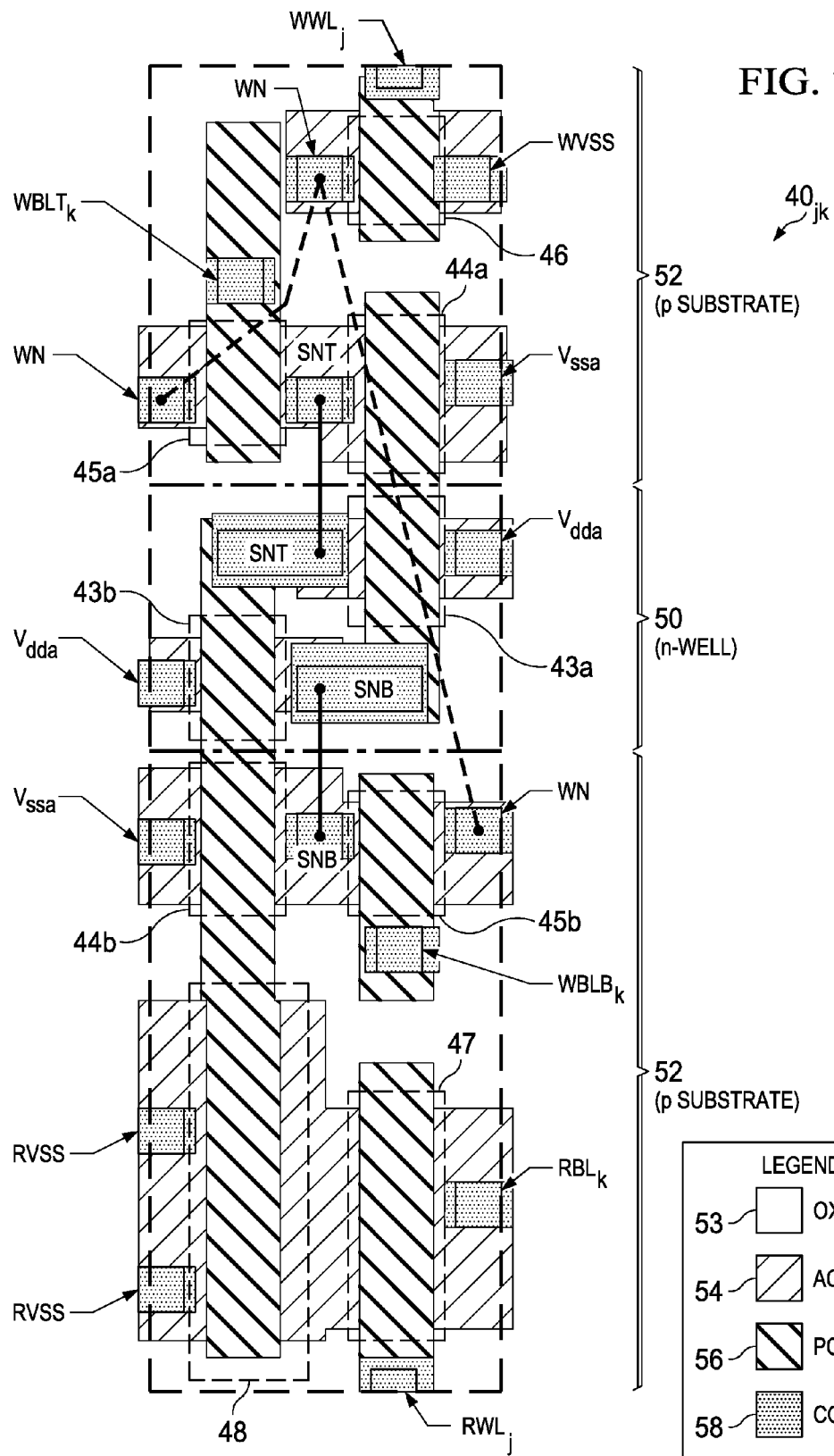
FIG. 7 is a plan view of the surface of an integrated circuit illustrating an example of the layout of the memory cell of FIG. 4 according to an embodiment of the invention.

It is contemplated that the implementation of SRAM cell 40$_{jk}$ into a CMOS integrated circuit can be achieved in a relatively efficient manner, from the standpoint of chip area. FIG. 7 shows, in plan view, an example of the layout of memory cell 40$_{jk}$ at the surface of a silicon substrate, fabricated according to conventional CMOS technology. This plan view of FIG. 7 illustrates cell 40$_{jk}$ prior to the formation of overlying metal layers, and as such illustrates diffused active regions 54, polysilicon gate elements 56, and contact openings 58 (both metal-to-active contacts, and also metal-to-poly contacts).

As shown in FIG. 7, cell 40$_{jk}$ is formed into a region of p-type substrate 52, at which n-well 50 has been formed by conventional methods. N-channel MOS transistors 44*b*, 45*b*, 47, 48 are formed into one region of p-type substrate 52, and re-channel MOS transistors 44*a*, 45*a*, 46 are formed into another region of p-type substrate 52. P-channel MOS transistors 43*a*, 43*b*, are formed into n-well 50, which in this example lies between the two regions of p-type substrate 52 in cell 40$_{jk}$; adjacent cells 40 can be formed on all four sides of cell 40$_{jk}$, such that n-well 50 and regions of substrate 52 can be shared from cell to cell. In the conventional manner, active regions 54 are defined at the surface, between isolation oxide structures 53 formed as LOCOS field oxide or as shallow trench isolation (STI) structures, also in the conventional manner. Polysilicon elements 56 are patterned to extend above the surface, separated from the surface by gate oxide (not visible in this plan view) or by isolation oxide 53, as the case may be. Of course, active regions 54 within n-well 50 that are not underlying poly elements 56 will be p-type, and active regions 54 within regions of p-type substrate 52 that are not underlying poly elements 56 will be n-type. Contact openings 58 extend to active regions 54 or to poly elements 56, at the locations shown in FIG. 7 for this layout. Metal conductors (shown schematically in FIG. 7) in one or more different levels from one another will overly the structure, making contact via respective contact openings 58 and corresponding "vias" between metal levels.

FIG. 7 illustrates the outline of the various transistors within cell 40$_{jk}$, corresponding to the electrical schematic of FIG. 4. In this FIG. 7, as is fundamental in the art, MOS transistors are located at regions of the surface at which a gate element (i.e., poly element 56 in this example) overlies an instance of active region 54. FIG. 7 schematically illustrates internal metal connections between certain contact openings 58. For example, a metal conductor will connect storage node SNT from active region 54 at the drain of transistor 44*a* and one side of the source/drain path of transistor 45*a* to the drain of transistor 43*a* and (via a shared contact opening 58) to poly element 56 serving as the gate of transistors 43*b* and 44*b*. Another metal conductor will connect storage node SNB from active region 54 between transistors 44*b*, 45*b* to shared contact opening 58 connecting active region 54 at the drain of transistors 43*b* and poly element 56 serving as the gate of transistors 43*a*, 44*a*, and 48. Other metal conductors will connect write node WN from the drain of transistor 46 to one side of the source/drain path of transistor 45*b*, and to one side of the source/drain path of transistor 45*a*.

In this embodiment of the invention, read buffer transistors 47, 48 have large channel widths, indicated by the width of poly elements 56 serving as their gates overlying active regions 54, as compared with other transistors in SRAM cell 40$_{jk}$. These relatively large read buffer transistors 47, 48 thus supply strong read current, as mentioned above. On the other hand, the channel widths of transistors 43*a*, 43*b*, 44*a*, 44*b* within storage element 41 (FIG. 4) can be constructed as minimum channel width devices, to reduce chip area. Also as mentioned above, transistors 43*a*, 43*b*, 44*a*, 44*b* can be constructed as high threshold voltage transistors, to reduce leakage; conversely, transistors 45*a*, 45*b*, 46 in write element 49, as well as read buffer transistors 47, 48, can be constructed as low threshold voltage transistors to improve performance and drive current. It is contemplated that transistors 45*a*, 45*b*, 46 in write element 49 can be constructed as minimum size logic transistors, and still normally satisfy the write margin and write speed requirements.

As evident from FIG. 7, SRAM cell 40$_{jk}$ can be efficiently realized from the standpoint of chip area, particularly as compared against conventional 8-T SRAM cells. While additional chip area for SRAM cell 40$_{jk}$ according to this embodiment of the invention is required, relative to conventional 6-T SRAM cells, it is contemplated that the elimination of disturb vulnerability, without impacting write margin or read current, that is provided by this embodiment of the invention will be a favorable tradeoff to the designer in many applications. It is contemplated that the ability to independently optimize storage element transistors, write element transistors, and read buffer transistors in the cell, particularly in constructing a very low leakage SRAM cell in combination with strong read current, excellent stability, and excellent write margins, will be especially attractive in low power applications.

Of course, the layout of FIG. 7 is presented by way of example only, it being understood that the particular layout of cell 40$_{jk}$ can vary widely from that shown, depending on the particular manufacturing technology and design rules applicable to each implementation, and on the layout optimization arrived at by those skilled in that art.

Figure 8:
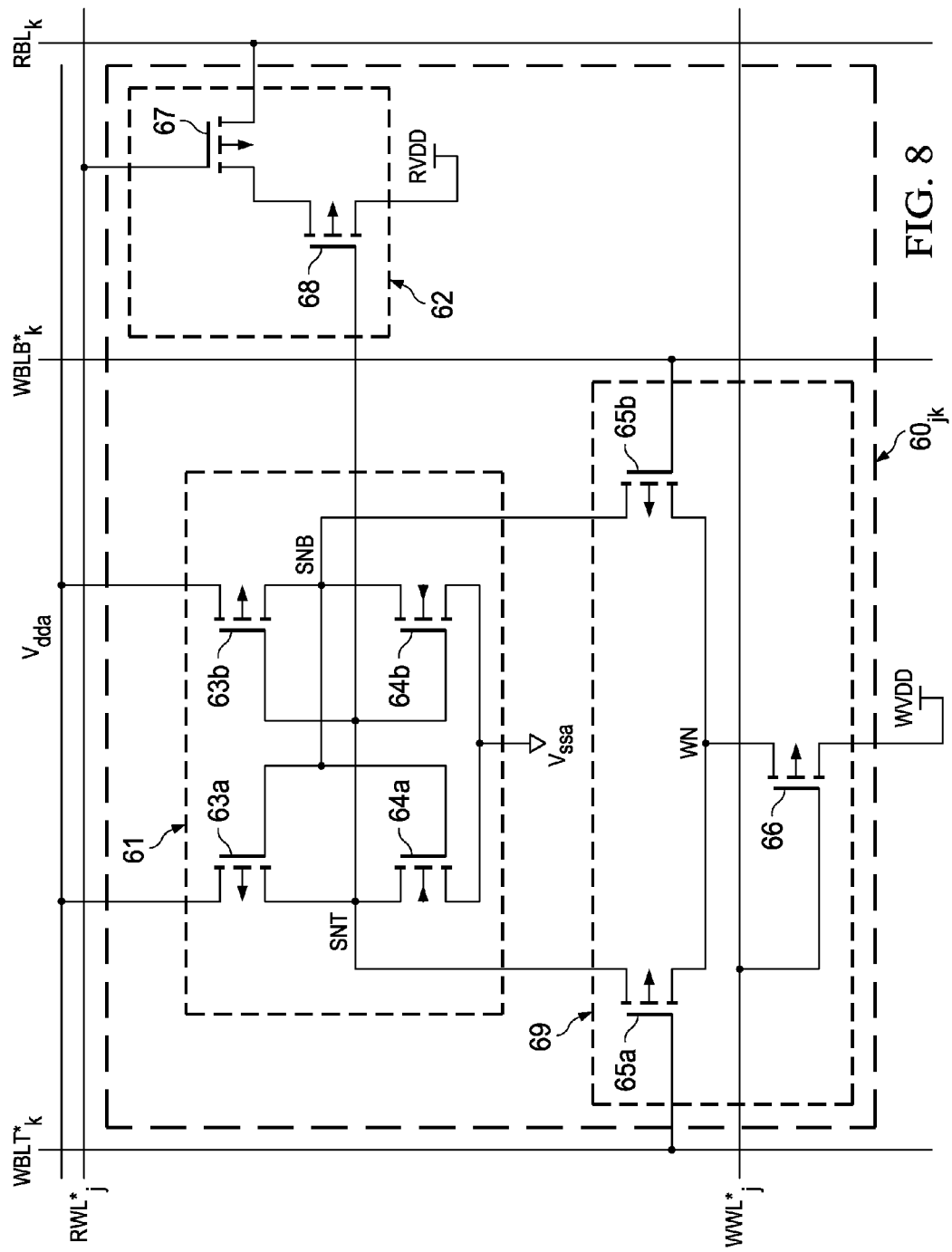
FIG. 8 is an electrical diagram, in schematic form, of a memory cell in the memory of FIG. 3 according to another embodiment of the invention.

Alternative embodiments of this invention are also contemplated. FIG. 8 illustrates SRAM cell $60_{jk}$ according to one alternative embodiment of the invention, by way of example. SRAM cell $60_{jk}$ corresponds to the memory cell in row j and column k of memory array 30, in the example of FIG. 3. Similarly as SRAM cell $40_{jk}$ described above, SRAM cell $60_{jk}$ includes storage element 61, in this example formed by a pair of cross-coupled CMOS inverters, each including respective ones of p-channel MOS load transistors 63a, 63b and n-channel MOS driver transistors 64a, 64b, connected in the manner described above.

SRAM cell $60_{jk}$ includes read buffer 62, which includes p-channel MOS pass transistor 67 and p-channel MOS driver transistor 68. Pass transistor 67 has its source/drain conduction path connected between the drain of p-channel MOS driver transistor 68 and read bit line $RBL_k$ for column k. Driver transistor 68 has its source connected to read power supply voltage RVDD (which may be at the same voltage as array power supply voltage $V_{dda}$, or may differ therefrom), and its gate connected to storage node SNT. The gate of pass transistor 67 is connected to receive read word line $RWL*_j$ (the * indicating negative logic) for row j containing SRAM cell $60_{jk}$. In operation during a read cycle, bit line $RBL*_k$ is precharged to a low level by precharge circuitry 37 (FIG. 3). Read word line $RWL*_j$ is driven to an active low level upon the row address indicating selection of row j in a read cycle, turning on pass transistor 67. The logic state at storage node SNT then determines whether driver transistor is turned on (for a "0" at storage node SNT) to charge read bit line $BLT_k$ toward read power supply voltage RVDD, or turned off (for a "1" at storage node SNT) such that read bit line $BLT_k$ remains at its precharged low level.

Write element 69 of SRAM cell $60_{jk}$ is similar to write element 49 of SRAM cell $40_{jk}$ described above, except that the transistors included in that circuitry are formed as p-channel MOS transistors rather than n-channel devices. More specifically, write select transistor 66 is a p-channel MOS transistor with its source connected to write power supply voltage WVDD (which may be at the same voltage as array power supply voltage $V_{dda}$ or read power supply voltage RVDD, or may differ therefrom) and its drain connected to write node WN; the gate of write select transistor 66 receives write word line $WWL*_j$. P-channel MOS write pass transistors 65a, 65b each have their sources connected at write node WN (at the drain of write select transistor 66). The drain of write pass transistor 65a is connected to storage node SNT, and the gate of write pass transistor 65a is connected to write bit line $WBLT*_k$. Conversely, write pass transistor 65b has its drain connected to storage node SNB, and its gate connected to write bit line $WBLB*_k$. As described above, write bit lines $WBLT*_k$, $WBLB*_k$ are controlled by read/write circuitry 34 to either both be inactive at a high level in read cycles, in standby, and in write cycles to columns other than column k, or to be driven to complementary logic levels for writing the input data to a cell 60 in column k. In operation during a write cycle to SRAM cell $60_{jk}$, transistors 65a and 66 drive storage node SNT to the level of write power supply voltage WVDD in response to row j being selected for a write cycle (write word line $WWL*_j$ at a low level) in combination with write bit line $WBLT*_k$ driven active low in response to the selection of column k and the input data level. Conversely, to write the opposite input data state for selected SRAM cell $60_{jk}$, transistors 65b and 66 pull storage node SNB to the level of write power supply voltage WVDD in response to the combination of both write word line $WWL*_j$ and write bit line $WBLB*_k$ being driven to an active low level.

As described above, transistors 63, 64 in storage element 61 of SRAM cell $60_{jk}$ can be constructed as minimum size transistors, and with relatively high threshold voltage if desired to minimize leakage current. Transistors 65, 66, 67, 68 in write element 69 and read buffer 62 can be constructed as low threshold "logic" transistors, if desired, to maximize drive capability and memory performance. In addition, transistors 67, 68 in read buffer 62 can be constructed as relatively large devices (similarly as shown in the layout of FIG. 7) to provide strong read current.

Figure 9:
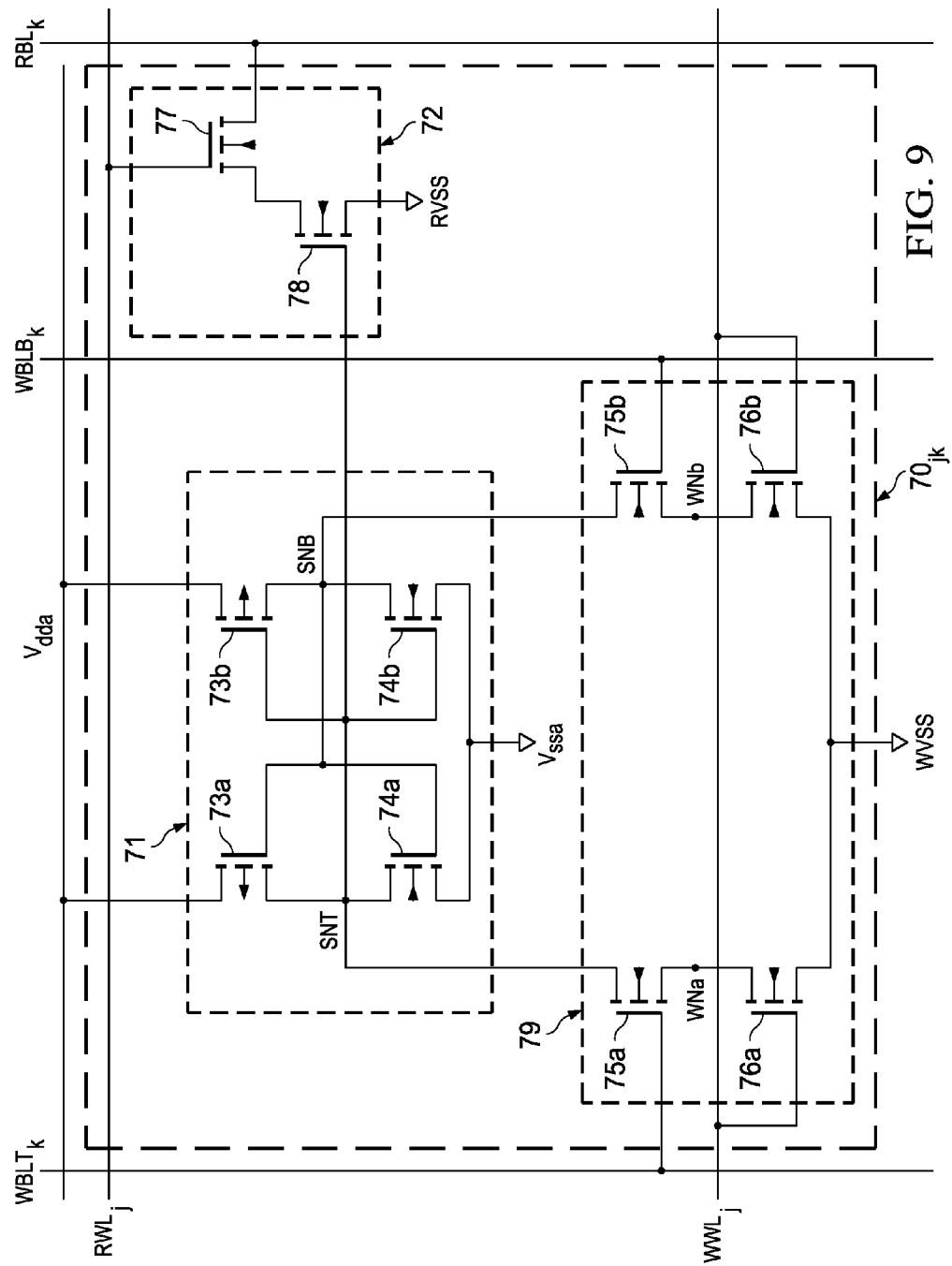
FIG. 9 is an electrical diagram, in schematic form, of a memory cell in the memory of FIG. 3 according to another embodiment of the invention.

FIG. 9 illustrates SRAM cell $70_{jk}$ according to another embodiment of the invention. Storage element 71 is constructed identically to that described above, incorporating cross-coupled CMOS inverters formed by p-channel MOS load transistors 73a, 73b, and n-channel MOS driver transistors 74a, 74b, biased between array power supply node $V_{dda}$ and array ground node $V_{ssa}$. Read buffer 72 is constructed from re-channel MOS pass transistor 77 with its source/drain conduction path connected between read bit line $RBL_k$ and the drain of n-channel MOS driver transistor 78, which has its source connected to read ground level RVSS and its gate connected to storage node SNT. Read word line $RWL_j$ is connected to the gate of pass transistors 77, controlling the communication of the state of storage node SNT to read bit line $RBL_k$ in a read cycle, in the manner described above.

Write element 79 of SRAM cell $70_{jk}$ in this embodiment of the invention incorporates separate write nodes WNa, WNb for storage nodes SNT, SNB, respectively. Write pass transistor 75a has its source/drain path connected between storage node SNT and write node WNa, and its gate connected to write bit line $WBLT_k$. In this embodiment of the invention, write select transistor 76a has its source/drain path connected between write node WNa and write ground level WVSS, and its gate connected to write word line $WWL_j$. Similarly, the source/drain paths of write pass transistor 75b and write select transistor 76b are connected in series between storage node SNB and write ground level WVSS, with write node WNb at their junction. The gate of write pass transistor 75b is connected to write bit line $WBLB_k$ and the gate of write select transistor 76b is connected to write word line $WWL_j$. In this example, transistors 75a, 75b, 76a, 76b are all re-channel MOS transistors; alternatively, these transistors may be realized by p-channel MOS transistors, using the complementary logic convention and voltages in the manner described above for SRAM cell $60_{jk}$ of FIG. 8.

The operation of SRAM cell $70_{jk}$ of this embodiment of the invention is similar to that described above for SRAM cell $40_{jk}$. In a write to a cell in row j, both of transistors 76a, 76b will be turned on by write word line $WWL_j$, coupling both of write nodes WNa, WNb to write ground level WVSS. In that event, if a write is being carried out to column k (meaning, of course, a write to SRAM cell $70_{jk}$ itself), one of write bit lines $WBLT_k$, $WBLB_k$ will carry a logic high level, causing that ground level voltage at its corresponding write node WNa, WNb to pull down its corresponding storage node SNT, SNB toward that write ground level.

It is understood, of course, that the construction of SRAM cell $70_{jk}$ involves the inclusion of an additional transistor (i.e., one of write select transistors 76a, 76b) into each memory cell. However, it may be preferable in some implementations to tolerate the additional chip area for this extra transistor, if the metal level routing required for the single write node would be too costly. It is contemplated that those skilled in the art having reference to this specification are readily capable of evaluating that tradeoff and implementing SRAM cell $70_{jk}$ or variations thereof as best suited for a particular realization.

Figure 10:
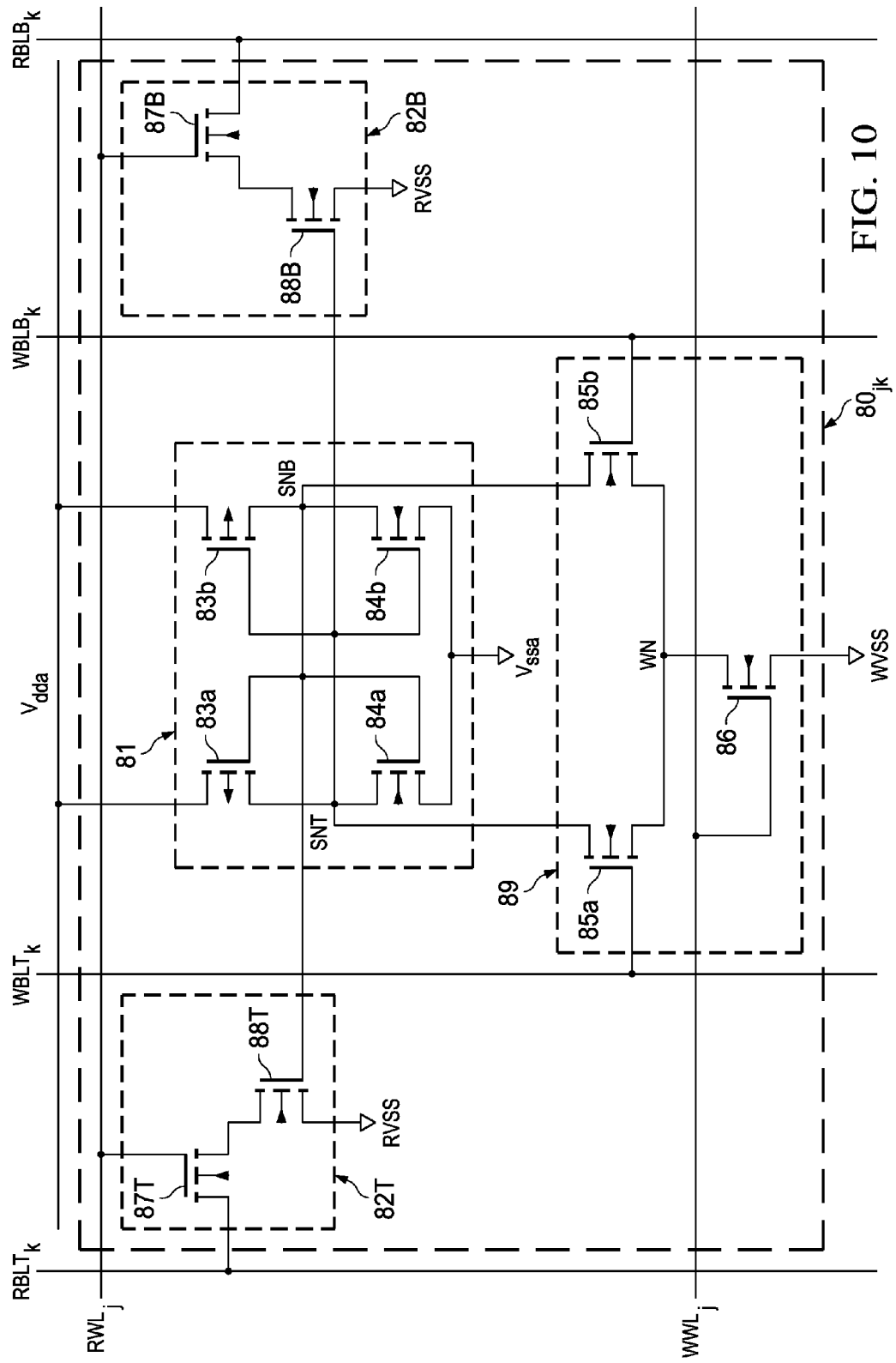
FIG. 10 is an electrical diagram, in schematic form, of a memory cell in the memory of FIG. 3 according to another embodiment of the invention.

Each of the SRAM cells according the embodiments of the invention described above provide a single-ended read signal, by virtue of their respective read buffers coupled to one of the cross-coupled storage nodes. It is contemplated, however, that some applications may require or prefer the output of a differential read signal. Referring now to FIG. 10, SRAM cell $80_{jk}$ according to another embodiment of the invention, and providing such a differential read signal output, will now be described.

As in the previously described embodiments of the invention, SRAM cell $80_{jk}$ includes storage element 81, in this example based on cross-coupled CMOS inverters formed by p-channel MOS load transistors 83a, 83b, and n-channel MOS driver transistors 84a, 84b, biased between array power supply node $V_{dda}$ and array ground node $V_{ssa}$. Write element 89 of SRAM cell $80_{jk}$ in this embodiment of the invention write circuitry operating in a "cross-point" manner, in that a write is performed to SRAM cell $40_{jk}$ in response to the combination of a row address-dependent signal (write word line WWL) indicating row j and a column address-dependent signal (write bit lines $WBLT_k$, $WBLB_k$) indicating column k. Cross-point write element 89 in SRAM cell $80_{jk}$ according to this example of the invention is constructed in the manner described above for SRAM cell $40_{jk}$. As shown in FIG. 10, write element 89 includes n-channel MOS write select transistor 86 with its source connected to write ground level WVSS, its drain connected to write node WN, and its gate receiving write word line $WWL_j$. N-channel MOS write pass transistors 85a, 85b each have their sources connected at write node WN, their drains connected to storage nodes SNT, SNB, respectively, and their gates connected to write bit lines $WBLT_k$, $WBLB_k$. The operation of SRAM cell $80_{jk}$ in a write cycle corresponds to that described above for SRAM cell $40_{jk}$. Alternatively, write element 89 of SRAM cell $80_{jk}$ of this embodiment of the invention may be implemented by splitting write node WN into separate write nodes WNa, WNb for storage nodes SNT, SNB, in the manner described above for SRAM cell $70_{jk}$ of FIG. 9.

According to this embodiment of the invention, SRAM cell $80_{jk}$ includes two read buffers 82T, 82B, each associated with a corresponding one of storage nodes SNT, SNB and a corresponding read bit line $RBLT_k$, $RBLB_k$. Read buffer 82T is constructed from n-channel MOS pass transistor 87T with its source/drain conduction path connected between read bit line $RBLT_k$ and the drain of n-channel MOS driver transistor 88T, which has its source connected to read ground level RVSS and its gate connected to storage node SNB. Similarly, read buffer 82B includes n-channel MOS pass transistor 87B with its source/drain path connected between read bit line $RBLB_k$ and the drain of n-channel MOS driver transistor 88B, which has its source connected to read ground level RVSS and its gate connected to storage node SNT. Read word line $RWL_j$ is connected to the gate of both pass transistors 87T, 87B.

While transistors 85, 86, 87, 88 in the example of FIG. 10 are all re-channel MOS transistors, these devices may alternatively be realized by p-channel MOS transistors and the corresponding complementary logic convention and voltages.

In operation, read bit lines $RBLT_k$, $RBLB_k$ are both precharged and then float, prior to a read cycle. The read of SRAM cell $80_{jk}$ (and, in fact, of any cell in that same row j) is initiated by read word line $RWL_j$ being asserted by row decoder 35 (FIG. 3) to an active high level in response to the selection of row j by the row address. Pass transistors 87T, 87B are both turned on, allowing the state of transistors 88T, 88B in response to the latched levels at storage nodes SNT, SNB, respectively, to define which of read bit lines $RBLT_k$, $RBLB_k$ is pulled toward read ground level RVSS. The differential voltage to which read bit lines $RBLT_k$, $RBLB_k$ settle presents a differential signal that can be sensed by a sense amplifier in the conventional manner.

Each of these embodiments of the invention provides a static random access memory cell that provides significant advantages over conventional memory cells. Embodiments of this invention provide such an SRAM cell that is disturb-free, in the sense that the latched storage nodes of its storage element are not coupled to bit lines in such a manner that the stored state can be disturbed by bit line levels and noise in cycles in which the cell is not selected by the memory address. Cross-point access (i.e., both row and column addressing) of each SRAM cell is required in order to write the data state of that cell; half-selection of SRAM cells according to embodiments of this invention is prevented. In addition, SRAM cells according to embodiments of this invention provide strong read current, while still permitting construction of storage element transistors by minimum feature size, high threshold, devices without impacting the drive and switching performance of reads or writes. These benefits can be attained by embodiments of this invention without prohibitive chip area penalty.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory cell, comprising:
    a storage element, having first and second complementary latched storage nodes, the storage element including two load transistors plus two driver transistors, each of the load and driver transistors having a high threshold voltage;
    a first read buffer coupled to the first storage node and to a first read bit line, the first read buffer selectively driving a data level at the first read bit line responsive to a read word line signal, the first read buffer including a first read driver transistor having a conduction path connected to a read reference voltage and having a control terminal coupled to the first storage node plus a first read pass transistor having a conduction path connected between the conduction path of the first driver transistor and the first read bit line, the first read pass transistor having a control terminal for receiving the read word line signal, the first read driver transistor and the first read pass transistor having a low threshold voltage, the first read driver transistor and the first read pass transistor also having a larger channel width than a channel width of the load and driver transistors; and
    a write element, comprising:
        at least one write select transistor, having a conduction path connected to a write reference voltage, and having a control electrode for receiving a write word line signal;
        a first write pass transistor having a conduction path connected between the first storage node and the conduction path of a write select transistor, and having a control electrode for coupling to a first write bit line; and
        a second write pass transistor having a conduction path connected between the second storage node and the conduction path of a write select transistor, and having a control electrode for coupling to a second write bit line.

2. The memory cell of claim 1, further comprising:
a second read buffer, comprising:
   a second read driver transistor having a conduction path connected to the read reference voltage and having a control terminal coupled to the second storage node; and
   a second read pass transistor having a conduction path connected between the conduction path of the second driver transistor and a second read bit line, and having a control terminal for receiving the read word line signal.

3. The memory cell of claim 1, wherein the at least one write select transistor comprises:
   a single write select transistor, having a source/drain path connected between the write reference voltage and a write node, and having a gate coupled to the write word line;
   wherein the first write pass transistor has a source/drain path connected between the first storage node and the write node, and has a gate coupled to the first write bit line;
   and wherein the second write pass transistor has a source/drain path connected between the second storage node and the write node, and has a gate coupled to the second write bit line.

4. The memory cell of claim 1, wherein the at least one write select transistor comprises:
   a first write select transistor, having a source/drain path connected between the write reference voltage and a first write node, and having a gate coupled to the write word line; and
   a second write select transistor, having a source/drain path connected between the write reference voltage and a second write node, and having a gate coupled to the write word line;
   wherein the first write pass transistor has a source/drain path connected between the first storage node and the first write node, and has a gate coupled to the first write bit line;
   and wherein the second write pass transistor has a source/drain path connected between the second storage node and the second write node, and has a gate coupled to the second write bit line.

5. An integrated circuit, comprising a solid state memory, the memory comprising:
   an array of solid-state memory cells arranged in rows and columns, each memory cell comprising:
      a storage element, having first and second complementary latched storage nodes, the storage element including two load transistors plus two driver transistors, each of the load and driver transistors having a high threshold voltage;
      a first read buffer coupled to the first storage node and to a first read bit line for its column, the first read buffer selectively driving a data level at the first read bit line responsive to a read word line for its row, the first read buffer including a first read driver transistor having a conduction path connected to a read reference voltage and having a control terminal coupled to the first storage node plus a first read pass transistor having a conduction path connected between the conduction path of the first driver transistor and the first read bit line, the first read pass transistor having a control terminal for receiving the read word line signal, the first read driver transistor and the first read pass transistor having a low threshold voltage, the first read driver transistor and the first read pass transistor also having a larger channel width than a channel width of the load and driver transistors; and
      a write element, comprising:
         at least one write select transistor, having a conduction path connected to a write reference voltage, and having a control electrode coupled to a write word line for its row;
         a first write pass transistor having a conduction path connected between the first storage node and the at least one write select transistor, and having a control electrode coupled to a first write bit line for its column; and
         a second write pass transistor having a conduction path connected between the second storage node and the at least one write select transistor, and having a control electrode coupled to a second write bit line for its column;
   address decoder circuitry, for receiving a row address portion of a memory address and a read/write control signal, for energizing a read word line associated with a row of memory cells corresponding to the row address portion in a read cycle, and for energizing a write word line associated with a row of memory cells corresponding to the row address portion in a write cycle;
   write circuitry coupled to the first and second write bit lines of each column of memory cells, for applying complementary data levels to the first and second write bit lines of at least one column corresponding to a column address portion of the memory address and the read/write control signal; and
   read precharge circuitry coupled to the first read bit line of each column of memory cells.

6. The integrated circuit of claim 5, wherein the at least one write select transistor of each memory cell comprises:
   a single write select transistor, having a source/drain path connected between the write reference voltage and a write node, and having a gate coupled to the write word line for its row;
   wherein the first write pass transistor has a source/drain path connected between the first storage node and the write node, and has a gate coupled to the first write bit line for its column;
   and wherein the second write pass transistor has a source/drain path connected between the second storage node and the write node, and has a gate coupled to the second write bit line for its column.

7. The integrated circuit of claim 5, wherein the at least one write select transistor of each memory cell comprises:
   a first write select transistor, having a source/drain path connected between the write reference voltage and a first write node, and having a gate coupled to the write word line for its row; and
   a second write select transistor, having a source/drain path connected between the write reference voltage and a second write node, and having a gate coupled to the write word line for its row;
   wherein the first write pass transistor has a source/drain path connected between the first storage node and the first write node, and has a gate coupled to the first write bit line for its column;
   and wherein the second write pass transistor has a source/drain path connected between the second storage node and the second write node, and has a gate coupled to the second write bit line for its column.

8. The integrated circuit of claim 5, further comprising:
a logic circuit coupled to the write circuitry and the address decoder circuitry.

9. The integrated circuit of claim 5, wherein each memory cell further comprises:
a second read buffer, comprising:
a second read driver transistor having a conduction path connected to the read reference voltage and having a control terminal coupled to the second storage node; and
a second read pass transistor having a conduction path connected between the conduction path of the second driver transistor and a second read bit line for its column, and having a control terminal for receiving the read word line signal for its row;
and wherein the read circuitry is also coupled to the second read bit line of each column of memory cells.

* * * * *